(12) United States Patent
Suzuki et al.

(10) Patent No.: US 7,297,982 B2
(45) Date of Patent: *Nov. 20, 2007

(54) SEMICONDUCTOR DEVICE INCLUDING A TFT HAVING LARGE-GRAIN POLYCRYSTALLINE ACTIVE LAYER, LCD EMPLOYING THE SAME AND METHOD OF FABRICATING THEM

(75) Inventors: Kenkichi Suzuki, Chiba (JP); Tetsuya Nagata, Ibaraki (JP); Michiko Takahashi, Chiba (JP); Masakazu Saito, Chiba (JP); Toshio Ogino, Chiba (JP); Masanobu Miyano, Fukuoka (JP)

(73) Assignee: Hitachi, Ltd., Tokyo (JP)

( * ) Notice: Subject to any disclaimer, the term of this patent is extended or adjusted under 35 U.S.C. 154(b) by 3 days.

This patent is subject to a terminal disclaimer.

(21) Appl. No.: 11/203,970

(22) Filed: Aug. 16, 2005

(65) Prior Publication Data

US 2006/0110869 A1 May 25, 2006

Related U.S. Application Data

(63) Continuation of application No. 10/339,435, filed on Jan. 10, 2003, now Pat. No. 6,965,122, which is a continuation of application No. 09/919,847, filed on Aug. 2, 2001, now Pat. No. 6,512,247, which is a continuation of application No. 09/479,919, filed on Jan. 10, 2000, now Pat. No. 6,274,888.

(30) Foreign Application Priority Data

Jan. 11, 1999 (JP) .................................... 11-3812

(51) Int. Cl.
*H01L 29/04* (2006.01)
*H01L 29/15* (2006.01)
*H01L 31/036* (2006.01)

(52) U.S. Cl. .................. 257/72; 257/59; 257/350; 257/E29.151; 257/E29.117

(58) Field of Classification Search ................ 257/57, 257/59, 66, 72, 347, 350, 354
See application file for complete search history.

(56) References Cited

U.S. PATENT DOCUMENTS 5,508,533 A 4/1996 Takemura (Continued)

FOREIGN PATENT DOCUMENTS

JP 04-139728 5/1992

(Continued)

OTHER PUBLICATIONS

Lee et al., "Pd Induced Lateral Crystallization of Amorphous Si Thin Films," Appl. Phys. Lett. 66 (13), Mar. 27, 1995, pp. 1671-1673.

(Continued)

*Primary Examiner*—Ngân V. Ngô
(74) *Attorney, Agent, or Firm*—Antonelli, Terry, Stout & Kraus, LLP.

(57) ABSTRACT

A display device includes a pixel region having a plurality of pixels and a peripheral circuit region disposed at a periphery of the pixel region for driving the pixels. The peripheral circuit region includes transistors fabricated from polycrystalline semiconductor and having a semiconductor crystalline grain of a first kind in a channel region thereof, wherein a grain size of the semiconductor crystalline grain of the first kind is at least 3 μm. The pixel region includes transistors fabricated from polycrystalline semiconductor and having a semiconductor crystalline grain of a second kind in a channel region thereof, wherein a grain size of the semiconductor crystalline grain of the second kind is at least 0.05 μm.

12 Claims, 16 Drawing Sheets

U.S. PATENT DOCUMENTS

| | | | |
|---|---|---|---|
| 5,572,046 A | 11/1996 | Takemura | 257/66 |
| 5,619,044 A | 4/1997 | Makita et al. | |
| 5,834,071 A | 11/1998 | Lin | |
| 5,858,823 A | 1/1999 | Yamazaki et al. | |
| 5,886,366 A | 3/1999 | Yamazaki et al. | |
| 5,949,091 A | 9/1999 | Yamaguchi | 257/64 |
| 6,064,090 A | 5/2000 | Miyamoto et al. | |
| 6,140,667 A | 10/2000 | Yamazaki et al. | |
| 6,166,396 A | 12/2000 | Yamazaki | |
| 6,215,154 B1 | 4/2001 | Ishida et al. | 257/347 |
| 6,278,127 B1 | 8/2001 | Dodabalapur et al. | 257/40 |
| 6,322,625 B2 | 11/2001 | Im | |
| 6,452,211 B1 | 9/2002 | Ohtani et al. | 257/64 |
| 6,512,247 B1 * | 1/2003 | Suzuki et al. | 257/72 |
| 6,965,122 B2 * | 11/2005 | Suzuki et al. | 257/72 |
| 2001/0014535 A1 | 8/2001 | Yamazaki | 438/689 |
| 2002/0043682 A1 | 4/2002 | Yamazaki et al. | 257/314 |
| 2004/0026740 A1 | 2/2004 | Kawasaki et al. | |
| 2004/0132233 A1 | 7/2004 | Yamazaki et al. | 438/149 |
| 2004/0135174 A1 | 7/2004 | Yamazaki et al. | 257/200 |
| 2004/0164300 A1 | 8/2004 | Yamazaki et al. | 257/72 |

FOREIGN PATENT DOCUMENTS

| | | |
|---|---|---|
| JP | 05-134272 | 5/1993 |
| JP | 7-99321 | 4/1995 |
| JP | 8-6053 | 1/1996 |
| JP | 8-69968 | 3/1996 |
| JP | 08-070129 | 3/1996 |
| JP | 08-078689 | 3/1996 |
| JP | 08-078690 | 3/1996 |
| JP | 8-83766 | 3/1996 |
| JP | 9-260670 | 3/1997 |
| JP | 9-289165 | 11/1997 |
| JP | 9-289166 | 11/1997 |
| JP | 10-64818 | 3/1998 |
| JP | 10-64819 | 3/1998 |
| JP | 10-125926 | 5/1998 |
| JP | 10-125927 | 5/1998 |
| JP | 10-135468 | 5/1998 |
| JP | 10-135469 | 5/1998 |
| JP | 10-173196 | 6/1998 |
| JP | 10-242050 | 9/1998 |
| JP | 10-294280 | 11/1998 |
| JP | 11-8196 | 1/1999 |
| JP | 11-87243 | 3/1999 |
| JP | 11-87733 | 3/1999 |
| JP | 11-121753 | 4/1999 |
| JP | 11-186164 | 7/1999 |
| JP | 11-186563 | 7/1999 |
| JP | 11-191628 | 7/1999 |

OTHER PUBLICATIONS

Sposil et al., "Sequential Lateral Solidification of Thin Silicon Films on SiO2" Appl. Phys. Lett. 69 (19), Nov. 4, 1996, pp. 2864-2866.

Nygren et al., "Impurity-Stimulated Crystallization and Diffusion in Amorphous Silicon" Appl. Phys. Lett. 52 (6), Feb. 8, 1988, pp. 439-441.

Hayzelden et al. "Silicide Formation and Silicide-Mediated Crystallization of Nickel-Implanted Amorphous Silicon Thin Films," J. Appl. Phys. 73 (12), Jun. 15, 1993, pp. 8279-8289.

Oh et al., "Preparations of Position-Controlled Crystal-Silicon Island Arrays by Means of Excimer-Laser Annealing" Jpn. J. Appl. Phys. vol. 37 (1998), pp. 5474-5479.

"Selective area crystallization of amorphous silicon films by low-temperature rapid thermal annealing" Gang Liu and S.J. Fonash, Applied Physics Letters, vol. 55(7), pp. 660-662, 1989.

* cited by examiner

SEMICONDUCTOR DEVICE INCLUDING A TFT HAVING LARGE-GRAIN POLYCRYSTALLINE ACTIVE LAYER, LCD EMPLOYING THE SAME AND METHOD OF FABRICATING THEM

CROSS-REFERENCE TO RELATED APPLICATIONS

This is a continuation of application Ser. No. 10/339,435, filed Jan. 10, 2003 (now U.S. Pat. No. 6,965,122); which is a continuation of application Ser. No. 09/919,847, filed Aug. 2, 2001 (now U.S. Pat. No. 6,512,247); which is a continuation of Ser. No. 09/479,919, filed Jan. 10, 2000 (now U.S. Pat. No. 6,274,888), the entire disclosures of which are hereby incorporated by reference.

BACKGROUND OF THE INVENTION

The present invention relates to a semiconductor device, a liquid crystal display device (hereinafter referred to as a liquid crystal display device) employing the semiconductor device and methods of fabricating the semiconductor device and the liquid crystal display device, and in particular to techniques of fabricating a thin film transistor (hereinafter referred to as a TFT) comprising a polycrystalline semiconductor on an insulating substrate.

There is a technique for fabricating peripheral circuits such as a driver circuit for driving pixels and a control circuit for controlling the driver circuit at the periphery of an insulating substrate on which pixels are fabricated in a liquid crystal display panel, for example.

The process for fabricating a polycrystalline Si TFT (hereinafter referred to as a p-Si TFT) of the peripheral circuits is intrinsically a hot-temperature process, but a low-temperature process for it is realized by using a process explained below.

The low-temperature process comprises formation of an amorphous silicon (hereinafter referred to as an a-Si) film, conversion of the a-Si film into a polycrystalline film by irradiation of excimer laser, formation of a gate insulating oxide film by plasma CVD or the like, formation of a gate electrode made of a metal or a metallic silicide by a sputtering method or the like, formation of source and drain regions by ion doping or ion implantation, and then ion activation by laser annealing.

The above crystallization of an a-Si film by excimer laser uses a phenomenon that irradiation of a TV light pulse of about 20 ns melts the a-Si film and then crystallization occurs as the a-Si film cools.

But with the conventional method, it is very difficult to control the grain sizes, orientations and positions of crystals in the polycrystalline film because of fast crystallization and non-equilibrium process.

The larger the grain sizes are, the better the performance of the p-Si TFT becomes, but the wider the spread in the grain sizes becomes and consequently the wider the variability of TFT characteristics becomes.

If the grain sizes are selected to be sufficiently smaller than the length of a channel of TFTs, the variability of the TFT characteristics becomes smaller, but the TFT characteristics are degraded.

The p-Si TFTs of the peripheral circuits in the liquid crystal panel are of the so-called SOI (Silicon-On-Insulator) type using an insulating substrate such as a glass substrate and are not capable of establishing a substrate potential, and consequently an adverse effect such as a projection called a "kink" occurs in a current-voltage characteristic curve especially of the p-Si TFT constituting the high-performance peripheral circuits.

SUMMARY OF THE INVENTION

It is an object of the present invention to provide a semiconductor device or an LCD provided with TFTs having a polycrystalline film uniform in orientation of crystalline grains and containing few unwanted impurities introduced in grain boundaries (hereinafter referred to merely as grain boundary impurities) and a channel region of the TFTs formed of a polycrystalline film comprising a small number of crystal grains each having a diameter larger than a length of a channel of the TFTs and each having a grain boundary thereof aligned parallel with a source-drain direction of the TFTs.

It is another object of the present invention to provide an LCD having a liquid crystal display panel provided with a peripheral circuit formed on a substrate of the liquid crystal display panel wherein TFTs constituting at least the peripheral circuit have a polycrystalline film uniform in orientation of crystalline grains in a plane parallel with a major surface of the substrate and containing few grain boundary impurities and a channel region of the TFTs formed of a polycrystalline film comprising a small number of crystal grains each having a diameter larger than a length of a channel of the TFTs and each having a grain boundary thereof aligned parallel with a source-drain direction.

It is another object of the present invention to provide a semiconductor device or an LCD having TFTs provided with a polycrystalline conductive layer in contact with a polycrystalline semiconductor layer forming an active area of each of the TFTs such that a potential of a substrate on which the TFTs are formed is established by the polycrystalline conductive layer.

To accomplish the above objects, in accordance with an embodiment of the present invention, there is provided a display device comprising a pixel region having a plurality of pixels and a peripheral circuit region disposed at a periphery of said pixel region for driving the plurality of pixels, the peripheral circuit region including transistors fabricated from polycrystalline semiconductor and having a semiconductor crystalline grain of a first kind in a channel region thereof, a grain size of the semiconductor crystalline grain of the first kind being at least 3 µm, the pixel region including transistors fabricated from polycrystalline semiconductor and having a semiconductor crystalline grain of a second kind in a channel region thereof, and a grain size of the semiconductor crystalline grain of the second kind being at least 0.05 µm.

To accomplish the above objects, in accordance with another embodiment of the present invention, there is provided a display device comprising a pixel region having a plurality of pixels and a peripheral circuit region disposed at a periphery of the pixel region for driving the plurality of pixels, the peripheral circuit region including transistors fabricated from polycrystalline semiconductor and having a semiconductor crystalline grain of a first kind in a channel region thereof, a grain size of the semiconductor crystalline grain of the first kind in a channel region of one of the transistors being large enough to extend into both source and drain regions disposed on opposite sides of the channel region of the one of the transistors.

To accomplish the above objects, in accordance with another embodiment of the present invention, there is provided a display device comprising a pixel region having a plurality of pixels and a peripheral circuit region disposed at a periphery of the pixel region for driving the plurality of pixels, the peripheral circuit region including transistors fabricated from polycrystalline semiconductor and having a semiconductor crystalline grain of a first kind in a channel region thereof, the pixel region including transistors fabricated from polycrystalline semiconductor and having a semiconductor crystalline grain of a second kind in a channel region thereof, and a grain size of the semiconductor crystalline grain of the second kind being smaller than a grain size of the semiconductor crystalline grain of the first kind.

To accomplish the above objects, in accordance with another embodiment of the present invention, there is provided a display device comprising a pixel region having a plurality of pixels and a peripheral circuit region disposed at a periphery of the pixel region for driving the plurality of pixels, the peripheral circuit region including transistors fabricated from polycrystalline semiconductor and having a semiconductor crystalline grain of a first kind in a channel region thereof, a grain size of the semiconductor crystalline grain of the first kind being at least 3 µm, the pixel region including transistors fabricated from polycrystalline semiconductor and having a semiconductor crystalline grain of a second kind in a channel region thereof, and a grain size of the semiconductor crystalline grain of the second kind being in a range from 0.05 µm to 0.3 µm.

BRIEF DESCRIPTION OF THE DRAWINGS

In the accompanying drawings, in which like reference numerals designate similar components throughout the figures, and in which.

DETAILED DESCRIPTION OF THE PREFERRED EMBODIMENTS

Figure 1A:
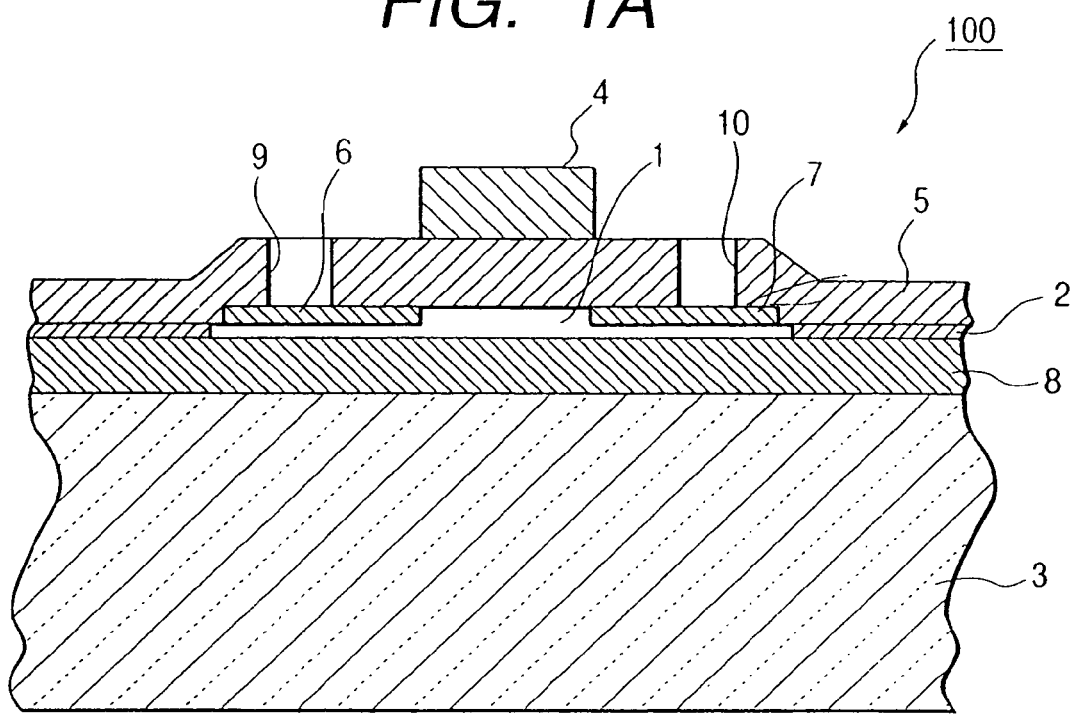
FIG. 1A is a schematic cross-sectional view of a basic structure of a p-Si TFT in accordance with an embodiment of the present invention.

The embodiments of the present invention will now be described in detail with reference to the accompanying drawings, in the several figures of which like reference numerals designate corresponding elements, and repetition of explanation of the corresponding elements is omitted.

In the following embodiments, the present invention is applied to p-Si TFTs in a peripheral circuit formed on a substrate of a liquid crystal display panel for driving pixels of the liquid crystal display panel, but the present invention is not limited to this application.

FIG. 1A is a schematic cross-sectional view of a basic structure of a p-Si TFT 100, an embodiment of the present invention, after contact holes having been opened for source and drain electrode connections.

In FIG. 1A, reference numeral 3 denotes an insulating substrate made of transparent glass, 8 is a buffer layer made of silicon oxide ($SiO_2$) and deposited on the substrate 3, 1 is an island (hereinafter referred to as a P-Si island) made of a polycrystalline silicon film (hereinafter referred to as a p-Si film), 2 is a conductive film which contacts the p-Si film 1 and crystal orientations of which are uniform in planes parallel with the major surface of the substrate, 5 is a gate insulating film made of $SiO_2$, 4 is a gate electrode made of metal or metallic silicide, 6 and 7 are source and drain regions, respectively, and 9 and 10 are contact holes for source and drain electrode connections, respectively.

Figure 1B:
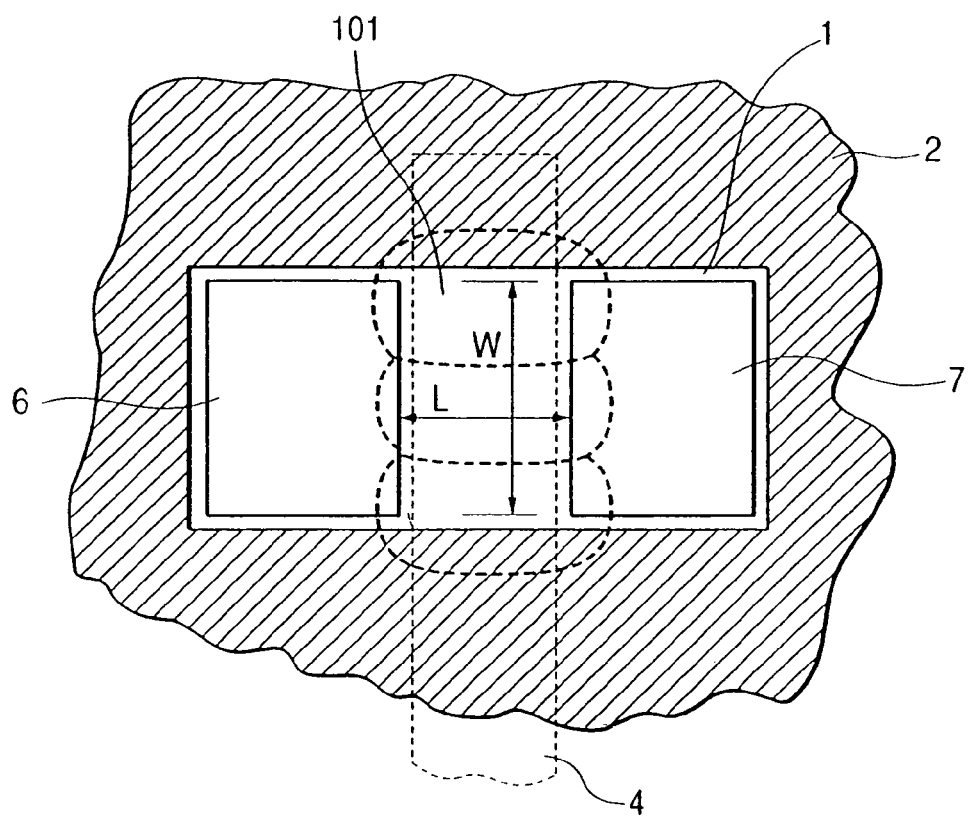
FIG. 1B is a plan view of the p-Si TFT of FIG. 1A with its gate insulating film and gate electrode removed.

FIG. 1B is a plan view of the p-Si TFT 100 of FIG. 1A with the gate insulating film 5 and the gate electrode 4 removed. The gate electrode 4 is indicated by broken lines in FIG. 1B. The channel region 101 is a region interposed between the source region 6 and the drain region 7.

Numerical examples of the p-Si TFTs for the peripheral circuit are:

Channel width=3-20 µm, channel length=1-5 µm, and numerical examples of the p-Si TFTs for the pixel switching circuit are:

Channel width=4-10 µm, channel length=3-5 µm.

Figure 2:
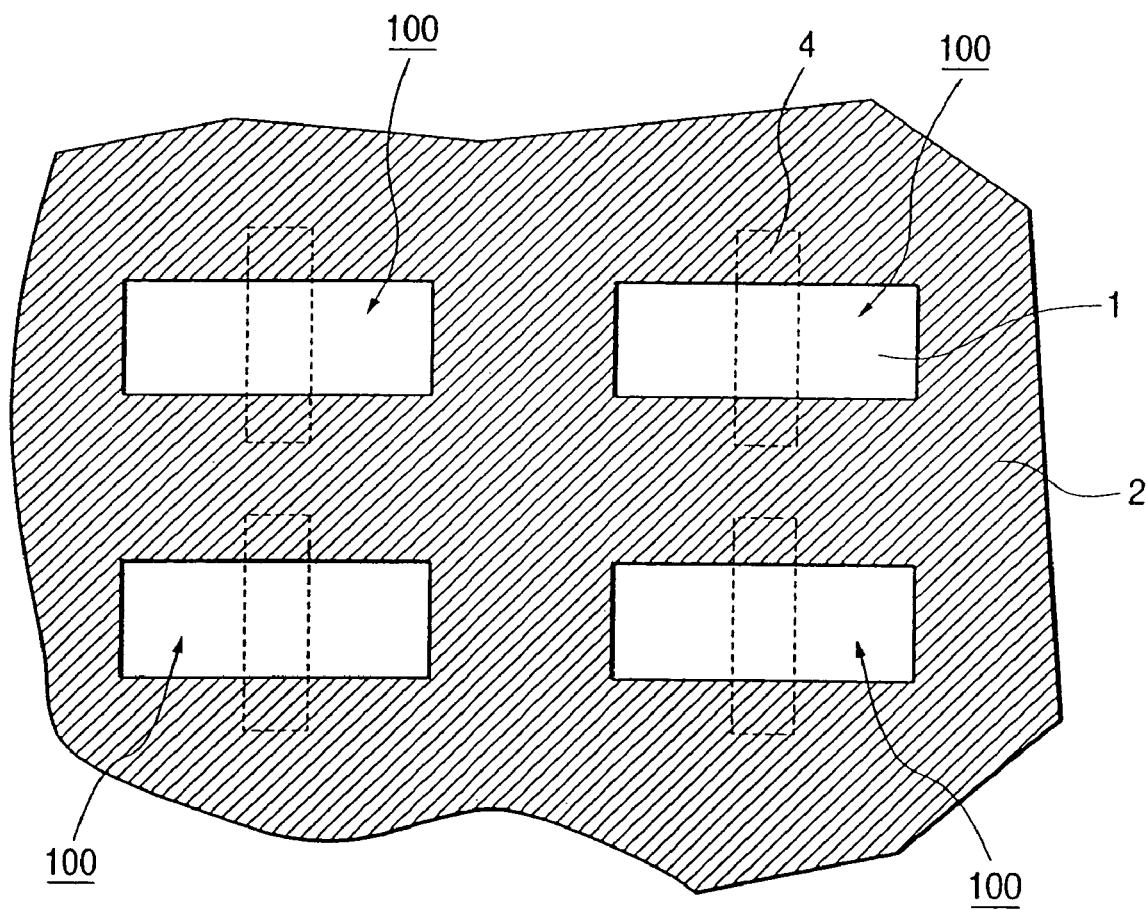
FIG. 2 is a schematic plan view illustrating the arrangement of the p-Si TFTs of FIG. 1A.

FIG. 2 is a schematic plan view of an arrangement of p-Si TFTs 100 of FIG. 1A. In FIG. 2, reference 1 denote p-Si islands, 2 is the conductive film which contacts the p-Si films 1 and crystal orientations of which are uniform in planes parallel with the major surface of the substrate, and 4 are gate electrodes.

As shown in FIG. 1A, the p-Si TFT 100 of this embodiment comprises the p-Si island 1 formed on the insulating substrate 3 with the buffer layer 8 therebetween, the conductive film 2 which contacts the p-Si island 1 and crystal orientations of which are uniform in planes parallel with the major surface of the substrate, the gate insulating film 5 formed over the p-Si island 1, the gate electrode 4 formed over the p-Si island 1 with the gate insulating film 5 interposed therebetween, the source and drain regions 6, 7 disposed in the p-Si island 1 on opposite sides of the gate electrode 4.

As shown in FIG. 2, the conductive layer 2 is formed with a two-dimensional rectangular array of openings each for forming the p-Si island 1 of the p-Si TFT 100.

As indicated by broken lines in FIG. 1B, the sizes of the crystalline grains in the channel region are at least 3 μm in the TFTs of the peripheral circuit for driving the pixels. The channel region of the TFTs comprised of a small number (three, for example, as illustrated in FIG. 1B) of the polycrystalline grains the sizes of which are greater than the channel length L of the TFTs and the grain boundaries of which are parallel to the direction of the channel length L. A single grain extends a distance of at least 0.5 μm outwardly from both edges of the gate electrode 4.

On the other hand, the TFTs for switching pixels need not provide such high performance as the TFTs for the peripheral circuits, and consequently plural crystalline grains of an approximately equal size in a range of 0.05 μm to 0.3 μm suffice for the TFTs for switching pixels.

The source and drain regions 6, 7 are a pair of impurity-introduced regions of N-type or P-type conductivity which are formed by ion-doping or ion-implanting the p-Si island 1 to a depth less than the thickness of the p-Si island 1 and then ion-activating by laser annealing. Although not shown in FIG. 1A, the source and drain regions 6,7 can employ the known LDD (Lightly Doped Drain) structure comprising a lightly doped region and a heavily doped region or the offset gate structure where the source and drain regions are offset from the edges of the gate electrode, respectively, if necessary.

Figures 1, 3A:
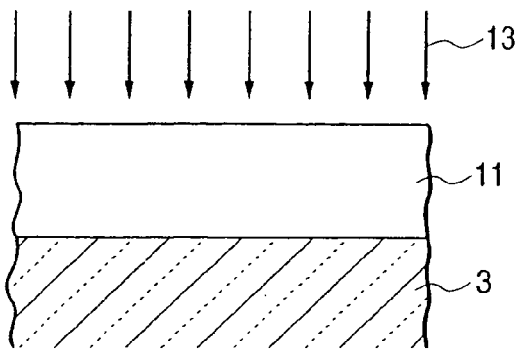
FIGS. 3A-1 to 3A-3 and 3B-1 to 3B-3 are illustrations of the principles of converting an a-Si film into a p-Si film with low-density energy and high-density energy, respectively.
Figures 1, 3B:
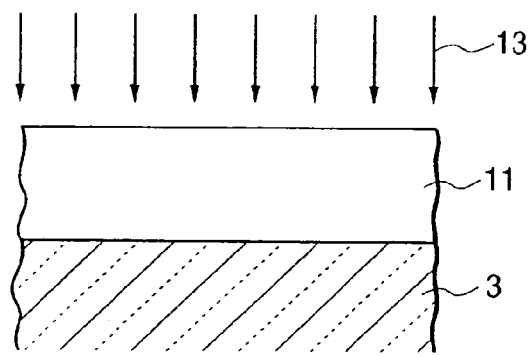
Figures 2, 3A:
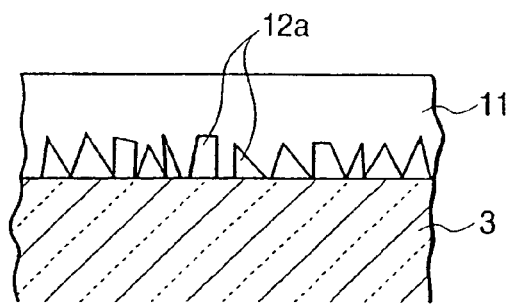
Figures 2, 3B:
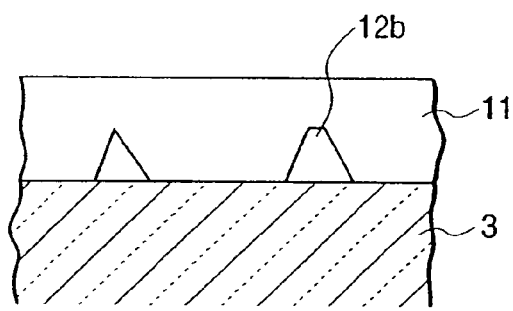
Figures 3, 3A:
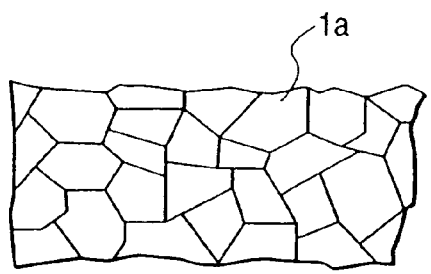
Figures 3, 3B:
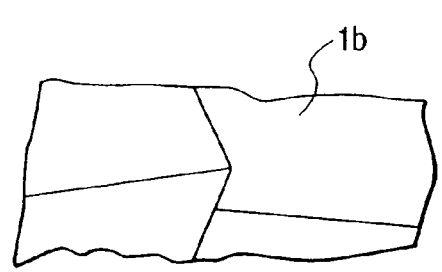

FIGS. 3A-1 to 3A-3 and FIGS. 3B-1 to 3B-3 illustrate the principle of the crystallization process from an a-Si film into a p-Si film by low-density energy irradiation and high-density energy irradiation, respectively. FIGS. 3A-1 and 3B-1 are schematic cross-sectional views of the films in a process of forming crystalline nucleuses by melting and cooling, FIGS. 3A-2 and 3B-2 are schematic cross-sectional views of the films in a process of growth from the crystalline nucleuses, and FIGS. 3A-3 and 3B-3 are schematic cross-sectional views of the films for illustrating a final distribution of grain sizes.

In FIGS. 3A-1 to 3A-3 and FIGS. 3B-1 to 3B-3, reference numeral 3 denotes the insulating substrate, 11 is the a-Si film formed on the insulating film 3, 13 is excimer laser light, 12a and 12b are nucleuses for the crystalline growth, and 1a and 1b are the p-Si films.

A common method of forming the p-Si film by a low-temperature process comprises irradiation of the excimer laser light onto the a-Si film to melt to it and crystallization in the liquid phase of the melt as the film cools. A model of this low-temperature process is illustrated in FIGS. 3A-1 to 3A-3 and FIGS. 3B-1 to 3B-3.

As illustrated in FIGS. 3A-1 and 3B-1, by irradiation of the excimer laser 13, the a-Si film 11 starts to melt from its surface and melts to a depth contacting the surface of the substrate 3.

As illustrated in FIGS. 3A-2 and 3B-2, in the subsequent process of cooling, nucleuses 12a, 12b are produced in the a-Si film 11 mostly at the interfaces between the substrate 3 and the a-Si film 11 and then grow to form the p-Si films 1a, 1b as illustrated in FIGS. 3A-3 and 3B-3, respectively.

When the density of irradiation energy is small, a large number of nucleuses 12a are produced as shown in FIG. 3A-2, grow in a direction of the thickness of the film, i.e. in a vertical direction, and finally form the p-Si film 1a composed of small grains as shown in FIG. 3A-3.

On the other hand, when the density of irradiation energy is large, a small number of nucleuses 12b are produced as shown in FIG. 3B-2, grow both vertically and laterally at the same time, and finally form the p-Si film 1b composed of large grains as shown in FIG. 3B-3.

As described above, the larger the grain sizes in the p-Si film are, the better the performance of the p-Si TFT becomes, and therefore it is the ultimate object to form the active elements of the peripheral circuit of the liquid crystal display panel in a single crystal.

There is a limit to the grain sizes enlarged by simply adjusting the laser irradiation conditions for crystallization and the positions of crystalline grain formation cannot be controlled.

To control the positions of crystalline grain formation and enlarge the grain sizes, it is necessary to initially form nucleuses at predetermined positions and then grow the nucleuses laterally. Based upon this concept, various methods have been proposed. An SLS method proposed by J. S. Im et al. (R. S. Sposili and J. S. Im: "Sequential lateral solidification of thin films on $SiO_2$", Appl. Phys. Lett. 69(19), 4 Nov. 1996, pp. 2864-2866) and a method of irradiating through a phase-shift mask proposed by M. Matsumura et al. (C. H. Oh and M. Matsumura: "Preparation of Position-Controlled Crystal-Silicon Island Arrays", Jpn. J. Appl. Phys. Vol. 37(1998) pp. 5474-5479) realize relatively large grain sizes for the present.

Both the two methods perform the formation of nucleuses and their lateral growth differently, but they do not control the sizes or the orientation of nucleuses. There are problems with the two methods in that, in the lateral growth, the growth speed is slow and the area of crystallization is small, due to limitation to an irradiation light-distribution.

The embodiment of the present invention employs methods of growing crystals known as Metal Induced Crystallization (sometimes hereafter referred to as MIC) and Metal Induced Lateral Crystallization (sometimes hereafter referred to as MILC), and control the nucleation, and solves the problem with the lateral growth by using excimer laser.

In the process of MIC, a thin metal film made of Au, Al, Sb, In, Pd, Ti, Ni or the like is disposed on the topside or underside of the a-Si film and thermally annealed, and consequently the transition temperature from a-Si to c-Si (crystalline Si) which is normally 600° C. is lowered due to the presence of the thin metal film such that crystallization proceeds at a temperature lower than 600° C.

The mechanism of the above process has not been fully understood yet. In the case of four metals, Au, Al, Sb and In, it is thought that silicon is transported from the amorphous phase to the crystalline phase via the metal compound containing silicon due to difference between solubility of the metal into the a-Si in the compound of the metal and the a-Si and solubility of the metal into the c-Si in the compound of the metal and the c-Si (see E. Nygren, et. al, Appl. Phys. Lett. 52(6) pp. 439-441(1988) for further detail). On the other hand, in the case of Pd, Ti and Ni, it is thought that the growth from the a-Si phase into the c-Si phase occurs via formation of silicide (see C. Hayzelden and J. L. Batstone, J. Appl. Phys. 73(12) pp. 8279-8289(1993) for further detail).

The metal induced crystallization (MIC) occurs in a region in contact with the thin metal film in the process of forming crystalline nucleuses assisted by the metal. It is observed that lateral crystalline growth occurs in a region not covered with the thin metal film, and this phenomenon is so-called metal induced lateral crystallization (MILC). In this method, although the growth speed of the p-Si film depends upon process conditions and material, it is on the order of μm per hour, very fast compared with usual solid-phase growth and this method provides large grains and aligns orientations of crystalline grains well enough in planes parallel with the major surface of the substrate (see Seok-Woon Lee, et. al, Appl. Phys. Lett. 66(13) pp. 1671-1673(1995) for further detail).

FIGS. 4A-4D are cross-sectional views of the film for explaining the principle of the formation of the p-Si film composed of large grains by producing nucleuses using the MIC and MILC methods.

Figure 4A:
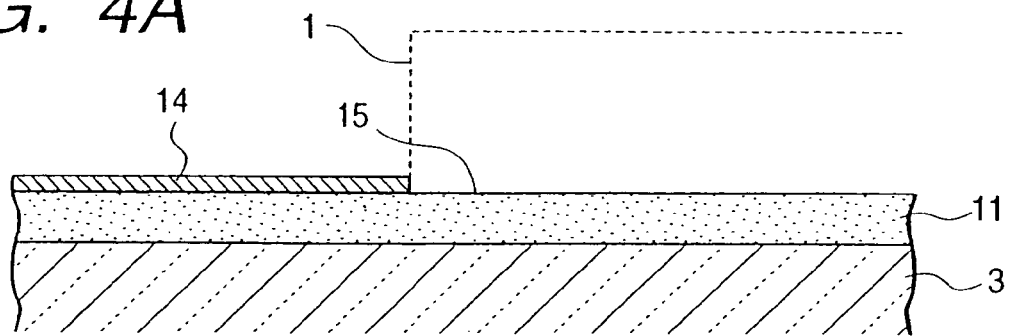
FIGS. 4A to 4D are cross-sectional views of a film in the process steps for fabricating a large grain-size p-Si film by using the principles of the MIC and the MILC to producing nucleuses.

Initially, as shown in FIG. 4A, a first a-Si thin film 11 is formed on a substrate 3, a metal film 14 serving as an undercoating film is deposited on the first a-Si thin film and then an opening 15 is made in the metal film 14 at a position corresponding to a p-Si island to be formed later by using a photolithography technique.

Then thermal annealing is performed at a low temperature (lower than 600° C.) insufficient to cause the transformation from the a-Si to the p-Si by using the MIC and MILC methods. In FIG. 4A, broken line indicate the edge of the p-Si island 1 (see FIG. 1A) to be fabricated subsequently. The a-Si film 11 under the metal film 14 is transformed into the p-Si film 16 (during this process the metal film 14 is absorbed by the p-Si film 16), and then the lateral growth of the crystalline grains, i.e. the above-explained MILC occurs in the region not originally covered with the metal film 14. Reference numeral 17 in FIG. 4B designate large crystalline grains produced by the MILC method.

It is desirable that the thickness of the metal film 14 is selected to be such a value that the metal film 14 is absorbed completely by the a-Si film within a thermal annealing time required for the lateral crystalline growth of at least 0.5 μm in length, but the metal film 14 need not necessarily be absorbed completely.

Figure 4B:
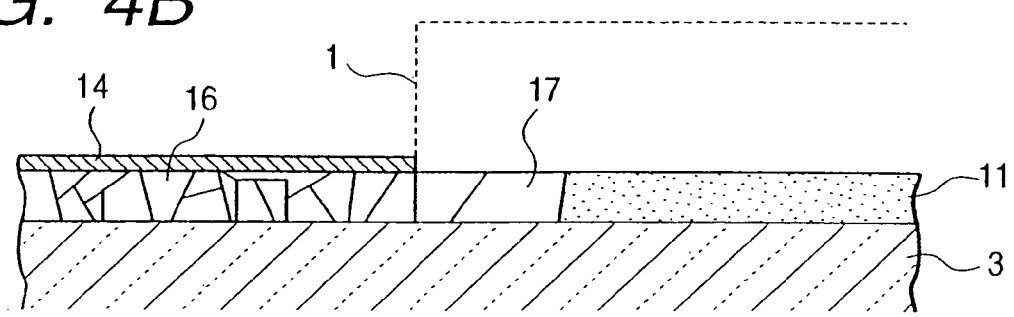

Even after the metal film 14 has been absorbed completely by the a-Si film, the portion of the film 11 at the center of the opening 15 remains the a-Si film as shown in FIG. 4B, and a single crystalline grain or large crystalline grains 17 having their orientations aligned parallel with each other in planes parallel with the major surface of the substrate are produced in contact with the a-Si film at the center.

Figure 4C:
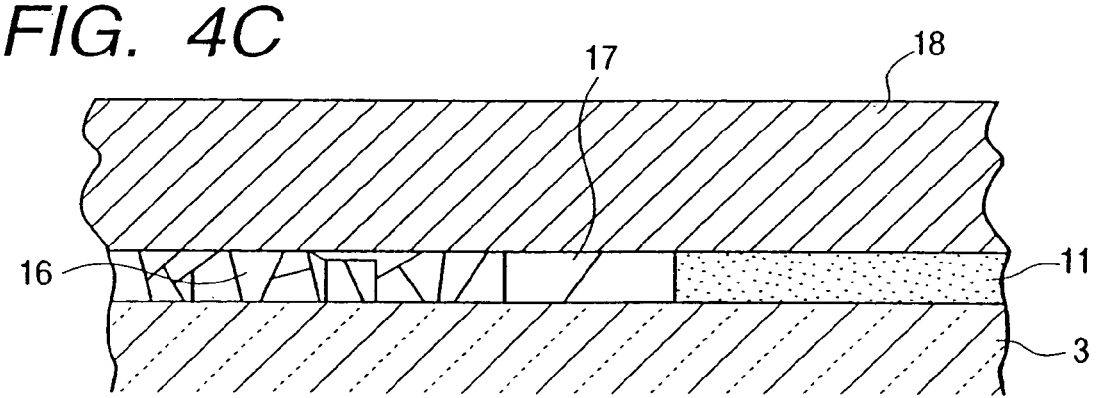
Figure 4D:
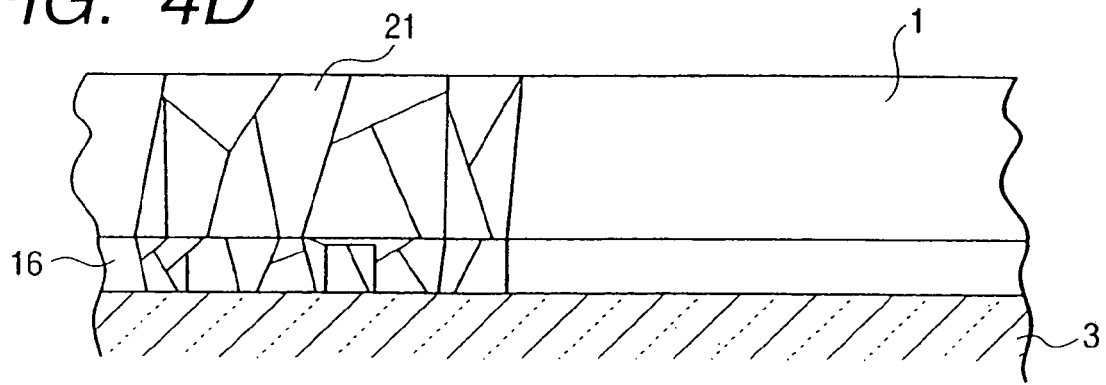

Then, as shown in FIG. 4C, a second a-Si film 18 is deposited over the entire area and irradiation of excimer laser (not shown) onto the a-Si film 18 crystallizes the a-Si film 18 according to the state of crystallization of the p-Si film 16 underlying the a-Si film 18 and serving as the undercoating film as shown in FIG. 4D. Especially in a portion of the a-Si film in proximity to large crystalline grains (as indicated by reference numeral 17, for example) large crystalline grains are formed aligned with the large crystalline grains. Reference numeral 1 denotes a p-Si film composed of large crystalline grains.

In this embodiment, it is desirable to transform a portion intended for a channel region of the TFT into a single crystal, but even if the region is divided by grain boundaries, when the number of the grains is small and the directions of the grain boundaries are parallel with the flowing direction of electric current, the TFT performance is expected to be approximately the same as that obtained with the single crystal. To fabricate such a grain structure, an area irradiated by laser is moved over the film such that crystallization proceeds from a region intended for one of drain and source regions toward a region intended to face a gate electrode or such that crystallization proceeds from a region intended for one of drain and source regions through the region intended to face the gate electrode toward a region intended for the other of the source and drain regions.

Then the unnecessary portion 21 of the p-Si film is removed by using the photolithography technique to form the p-Si island 1 indicated by broken lines in FIGS. 4A and 4B (see FIG. 1A also). There is retained a conductive layer made of the Si film and the metal absorbed therein and having its crystalline orientations aligned parallel with each other in the planes parallel with the major surface of the substrate, in order to be used for establishing a substrate potential.

Figure 5A:
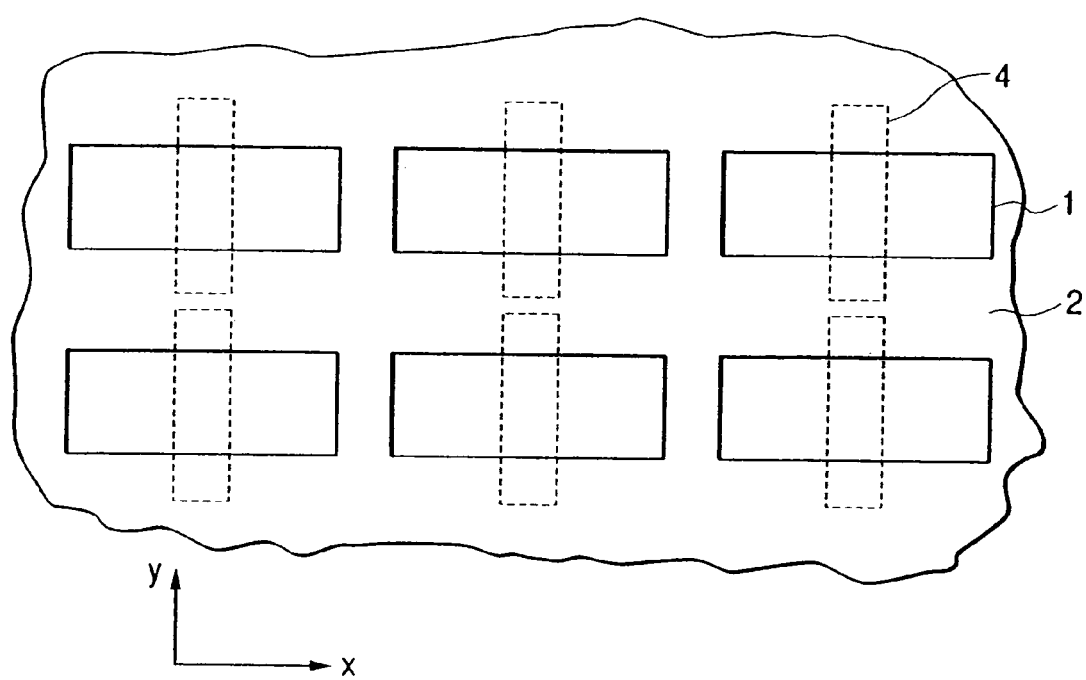
FIGS. 5A to 5C are illustrations for explaining an intensity distribution of excimer laser in the fabrication of p-Si TFTs, FIG. 5A being a plan view of the arrangement of p-Si islands fabricated on an insulating substrate, FIG. 5B being an ideal illuminating intensity distribution of laser and FIG. 5C being a transmission distribution of a multilayer dielectric mask.
Figure 5B:
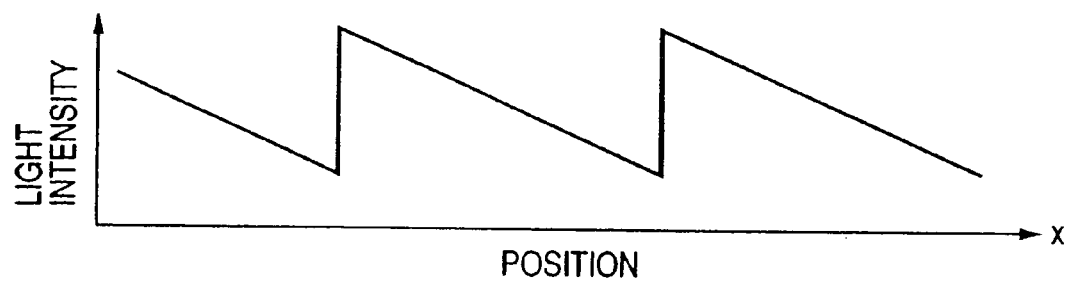
Figure 5C:
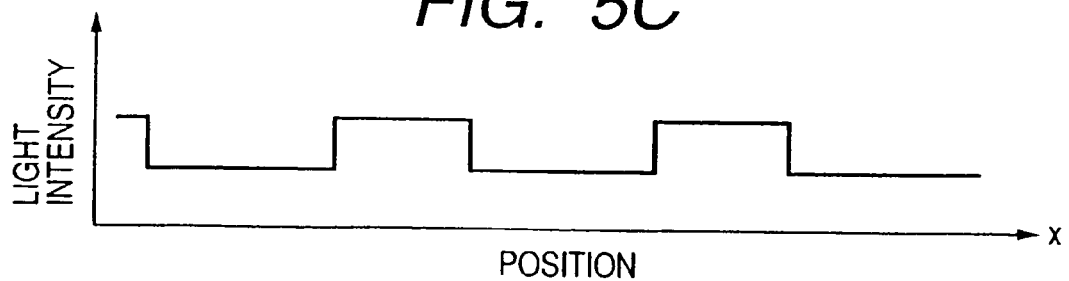

To obtain a crystalline grain of at least 10 μm in size which is a practical length for transistors, it is necessary to utilize diffusion of material by thermal gradient. There are a number of methods proposed for performing this by using laser irradiation, one of which will be explained by reference to FIGS. 5A-5C. FIGS. 5A-5C are illustrations for explaining an intensity distribution of excimer laser irradiation for formation of the p-Si TFT 100. FIG. 5A is a plan view of an arrangement of the p-Si islands 1 formed on the insulating substrate 3 (not shown) and the conductive layer 2 disposed in contact with the p-Si islands 1, and in FIG. 5A the gate electrodes 4 are indicated by broken lines to facilitate understanding. FIG. 5B illustrates an ideal intensity distribution of laser irradiation, and FIG. 5C illustrates a distribution of light transmission of a mask comprised of plural dielectric films.

As shown in FIG. 5B, the ideal intensity distribution of laser irradiation is such that the irradiation extends wider than the width of a portion intended for one transistor in a direction of crystalline growth (a direction of the long sides of the p-Si islands 1 of FIG. 5A), but does not extend to adjacent portions intended for transistors.

In practice, it is difficult to obtain the linear intensity distribution of laser irradiation for individual transistors as shown in FIG. 5B, consequently it is practically useful to use a mask obtained by fabricating plural dielectric layers in the form of steps, and FIG. 5C shows an example of the intensity distribution of such a mask.

Figure 6A:
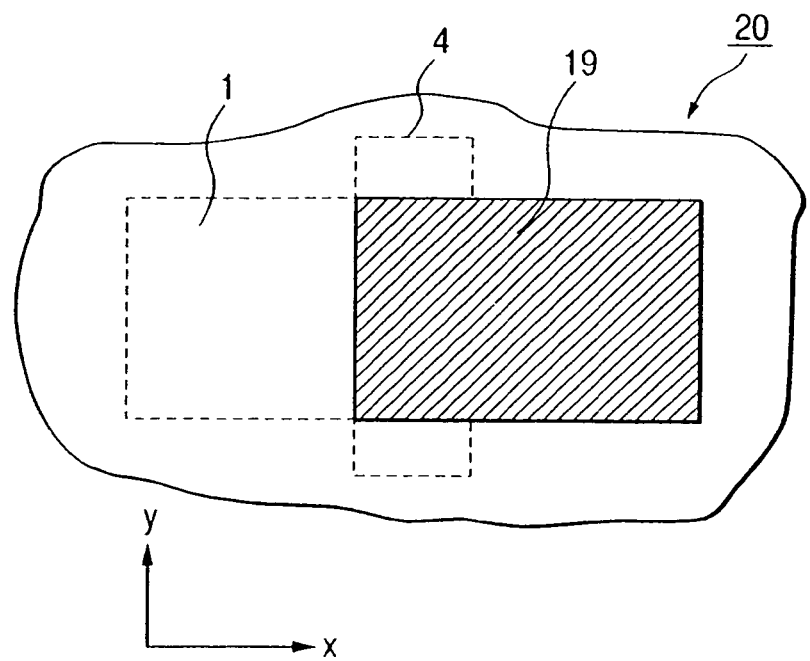
FIGS. 6A and 6B are illustrations for explaining a basic structure of a mask for laser illumination in the fabrication of a peripheral circuit for a liquid crystal display panel, FIG. 6A being a schematic plan view of the mask and FIG. 6B being a transmission distribution of the mask.
Figure 6B:
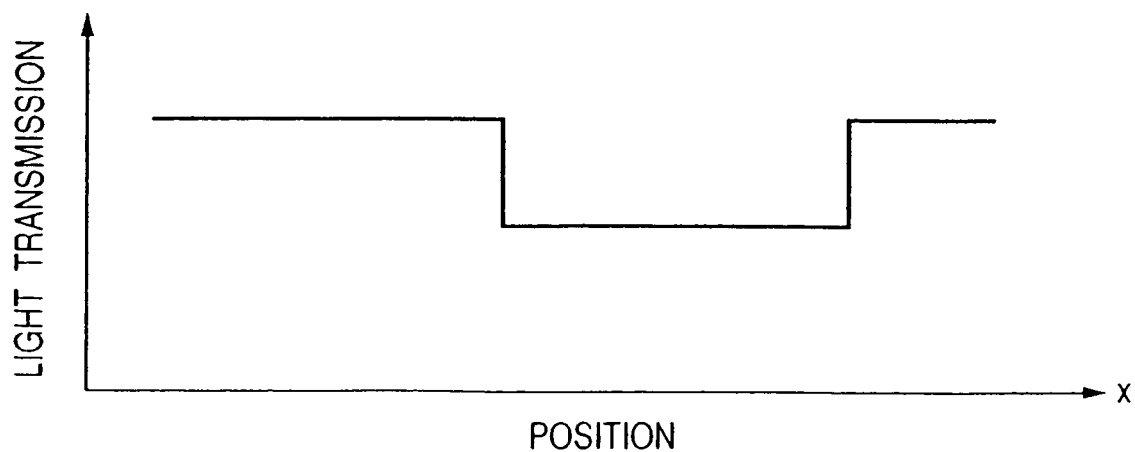

FIGS. 6A and 6B are illustrations for explaining a basic structure of the irradiation mask for fabrication of the peripheral circuit portion of the liquid crystal display panel, FIG. 6A is a schematic plan view of the mask having a dielectric multilayer portion for reflecting (i.e. blocking) laser light, and FIG. 6B illustrates a difference in transmission between the transmissive and non-transmissive portions of the dielectric multilayer films. In FIG. 6A, reference 20 denotes the mask and 19 is the laser-reflecting portion of the dielectric mask.

The p-Si TFTs in the liquid crystal display panel is of the so-called SOI structure fabricated on the insulating substrate such as glass. As explained above, the potential of the substrate cannot be established by the substrate itself unlike Si LSIs because the substrate is an insulator, and the greatest problem that arises due to this is that a breakdown voltage between the source and drain regions is lowered. This is because holes generated by high electric fields present in the vicinity of the drain region are accumulated in the lower portion of the channel and cause a parasitic bipolar transistor to be turned on. This problem is solved by disposing a conductive film on the substrate and establishing the substrate potential, but the parasitic capacitance increases to such a great extent that desired TFT characteristics are not obtained.

Especially the SOI structure has a reduced parasitic capacitance and an insulating substrate, and consequently provides excellent characteristics such as high speed operation, low power consumption and high breakdown voltages. But this useful structure produces the problem of lowering the source-drain breakdown voltage.

The above-mentioned disposition of the conductive film on the substrate is such that the charges accumulated at the interface with the substrate are extracted by the conductive layer 2 disposed in contact with the above-explained electrode structure, i.e. the p-Si islands 1 and having its crystalline orientations aligned to eliminate causes of unstable operation. This structure is known as the field shield in the conventional SOI structure (Proc. of 5th Int'l Symp. on SOI Tech. and Devices, Vol. 92-13, p64 (1992). In this embodiment, the undercoating film used for the MIC and MILC processes is remaining even during the process of laser crystallization. The accumulated charges are extracted more efficiently from the central portion of the channel as well as the ends of the source and drain regions compared with the conventional structures, though resistance of these regions is very high because of a small amount of the metal in these regions.

Figure 7A:
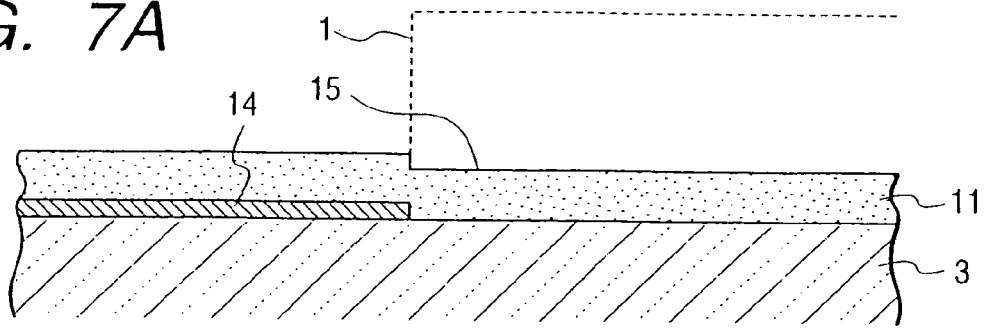
FIGS. 7A to 7D are cross-sectional views of a film in the alternative process steps for fabricating a large grain-size p-Si film by using the principles of the MIC and the MILC to producing nucleuses.
Figure 7B:
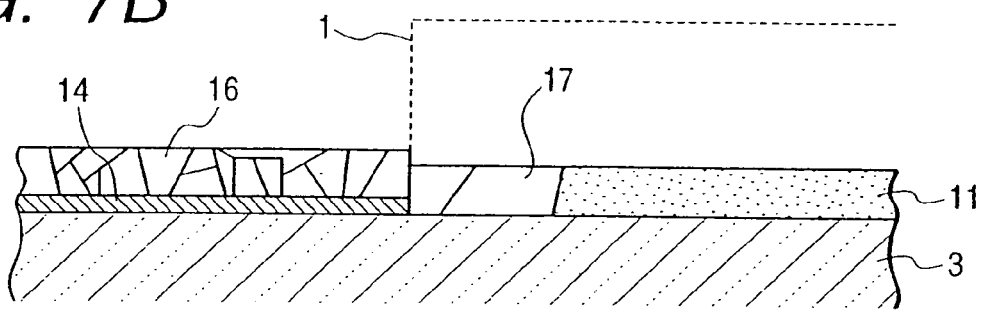
Figure 7C:
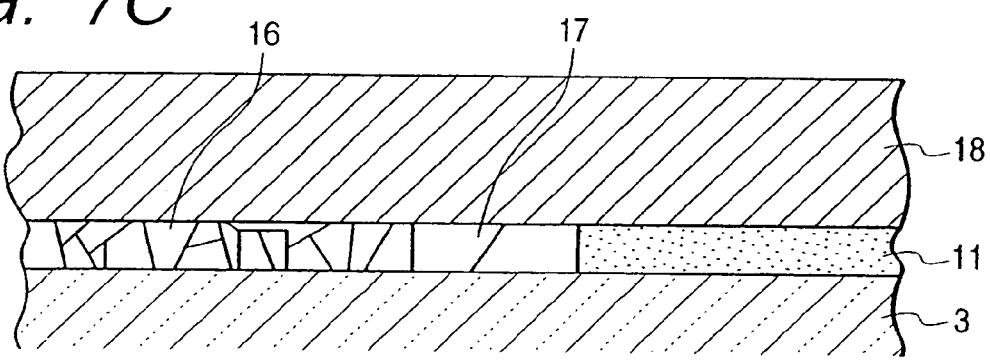
Figure 7D:
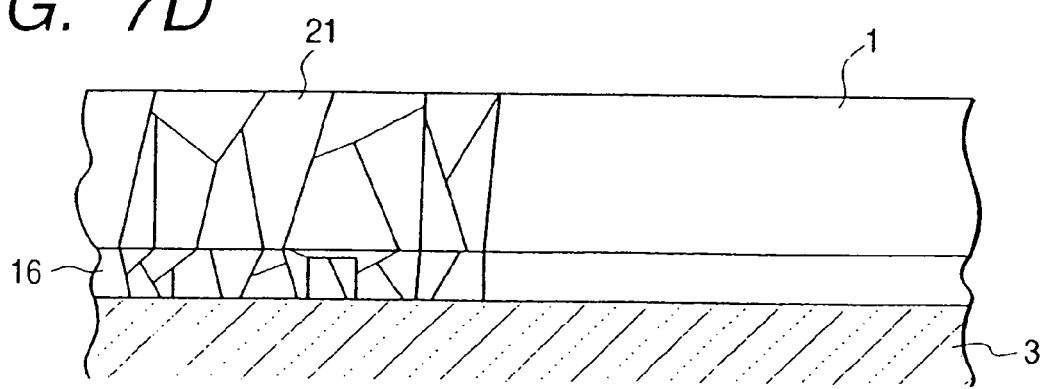

Instead of disposing the metal film 14 on the top surface of the a-Si film 11 as shown in FIG. 4A, the metal film 14 can be disposed under the a-Si film 11 as shown in FIG. 7A. The process steps following the step shown in FIG. 7A are similar to those in the case where the metal film 14 is disposed on the top surface of the a-Si film 11, as shown in FIGS. 7B-7D.

Instead of the metal film, a film made of metallic suicides such as titanium silicide, tungsten silicide or molybdenum silicide can be used in this embodiment.

A fabrication process in accordance with an embodiment of the present invention will be explained by reference to FIGS. 8A-8F.

Figure 8A:
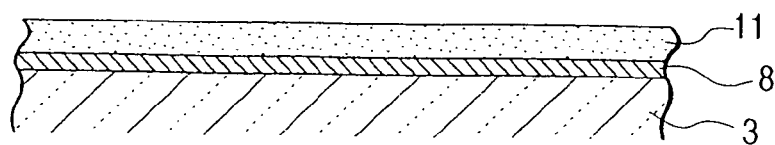
FIGS. 8A to 8F are cross-sectional views of a film in the process steps for fabricating a p-Si TFT in accordance with an embodiment of the present invention.

Initially, as shown in FIG. 8A, a buffer layer 8 made of SiO$_2$ is formed on the insulating substrate 3 made of glass, then the a-Si film 11 of 20 nm at the most in thickness is formed on the buffer layer 8 by a plasma CVD method, and is heated at 450° C. for at least 30 minutes to reduce the amount of hydrogen contained in the a-Si film to 1 atomic % at the most.

Figure 8B:
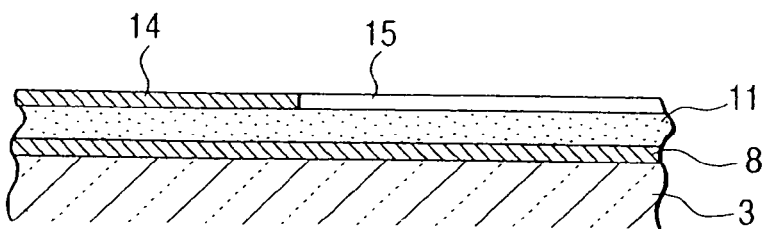

Then, as shown in FIG. 8B, at least one layer 14 made of metals such as W, Au, Al, Sb, In, Pd, Ti or Ni or silicides of those metals is formed on the a-Si film 11 by a sputtering method, and is formed with a two-dimensional rectangular array of openings (slits) 15 each corresponding to a TFT region by a photolithography technique.

Figure 8C:
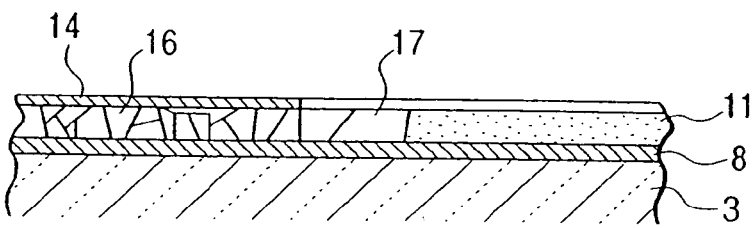

Then, as shown in FIG. 8C, the a-Si film 11 is thermally annealed at a temperature equal to or less than 600° C. to transform the a-Si film 11 into the p-Si film by solid-phase growth. Initially the a-Si film 11 underlying the film 14 is transformed into the p-Si film 16 (during this process the film 14 is absorbed by the p-Si film 16), and then the lateral growth of crystalline grains, i.e. the above-described MILC occurs in the region not covered with the film 14. Reference numeral 17 denotes large crystalline grains produced by the MILC.

Figure 8D:
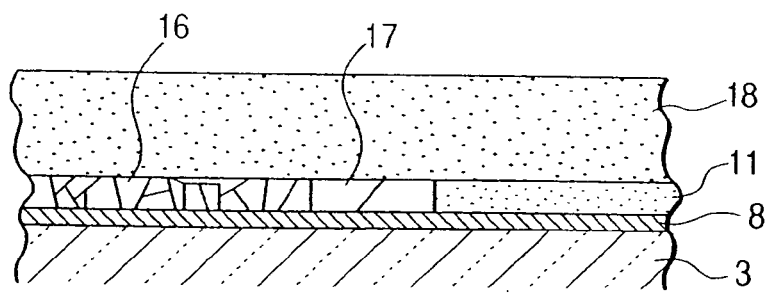

Then, as shown in FIG. 8D, another a-Si film 18 of at least 20 nm in thickness is formed on the film formed as shown in FIG. 8C by a plasma CVD method, and then is heated at 450° C. for at least 30 minutes to reduce the amount of hydrogen contained in the a-Si film to 1 atomic % at the most.

Figure 8E:
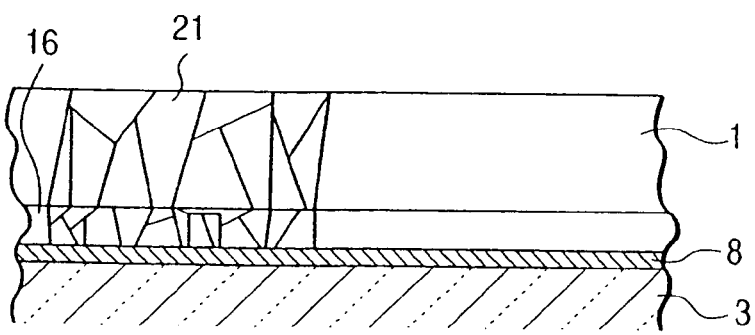

Then, as shown in FIG. 8E, XeCl excimer laser of 308 nm in wavelength or KrF excimer laser of 248 nm in wavelength (not shown) is irradiated onto the a-Si film 18 to transform the a-Si film 18 into the p-Si film to form a region corresponding to the p-Si island 1.

Figure 8F:
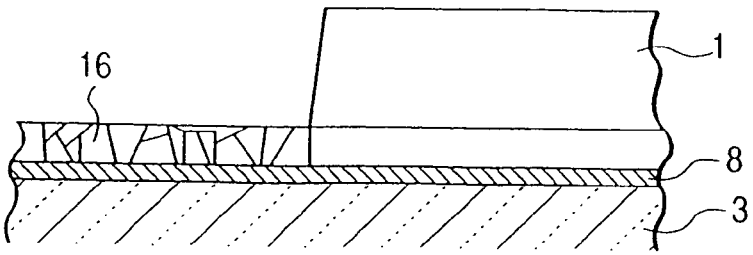

Then the p-Si film 21 surrounding the p-Si island 1 is removed by a photolithography technique to provide the shape as shown in FIG. 8F.

Then the thus obtained p-Si island 1 is processed to complete the p-Si TFT 100 shown in FIG. 1A by using known techniques. The p-Si film 16 in FIG. 8F corresponds to the conductive film 2 in FIG. 1A.

In the above-explained method, the metal film having the openings are disposed over the a-Si film formed on the substrate, but in an alternative method the a-Si film can be formed over the metal film having the openings and initially formed on the substrate. The following explains this alternative method.

Figure 9A:
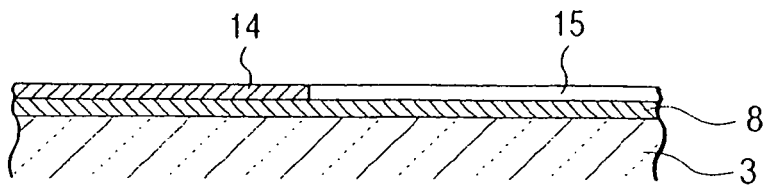
FIGS. 9A to 9F are cross-sectional views of a film in the process steps for fabricating a p-Si TFT in accordance with another embodiment of the present invention.

Initially, as shown in FIG. 9A, a buffer layer 8 made of SiO$_2$ is formed on the insulating substrate 3 made of glass, then at least one layer 14 made of metals such as W, Au, Al, Sb, In, Pd, Ti or Ni or silicides of those metals is formed on the buffer layer 8 by a sputtering method, and then is formed with a two-dimensional rectangular array of openings (slits) 15 each corresponding to a TFT region by a photolithography technique.

Figure 9B:
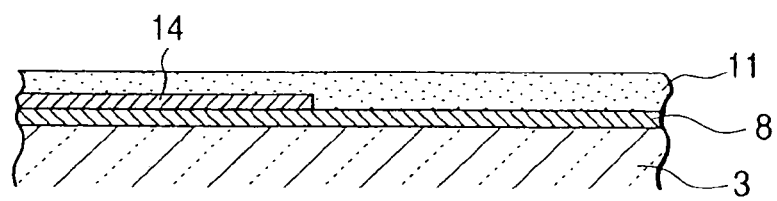

Then, as shown in FIG. 9B, the a-Si film 11 of 20 nm at the most in thickness is formed on the substrate 3 having the film 14 formed with the openings 15 by a plasma CVD method, and is heated at 450° C. for at least 30 minutes to reduce the amount of hydrogen contained in the a-Si film to 1 atomic % at the most.

Figure 9C:
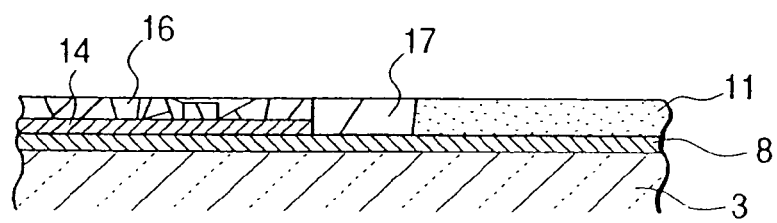

Then, as shown in FIG. 9C, the a-Si film 11 is thermally annealed at a temperature equal to or less than 600° C. to transform the a-Si film 11 into the p-Si film by solid-phase growth. Initially the a-Si film 11 underlying the film 14 is transformed into the p-Si film 16 (during this process the film 14 is absorbed by the p-Si film 16), and then the lateral growth of crystalline grains, i.e. the above-described MILC occurs in the region not covered with the film 14. Reference numeral 17 denote large crystalline grains produced by the MILC.

Figure 9D:
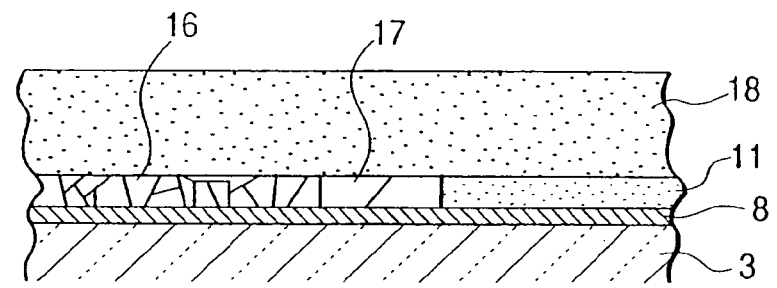

Then, as shown in FIG. 9D, another a-Si film 18 of at least 20 nm in thickness is formed on the film formed as shown in FIG. 9C by a plasma CVD method, and then is heated at 450° C. for at least 30 minutes to reduce the amount of hydrogen contained in the a-Si film to 1 atomic % at the most.

Figure 9E:
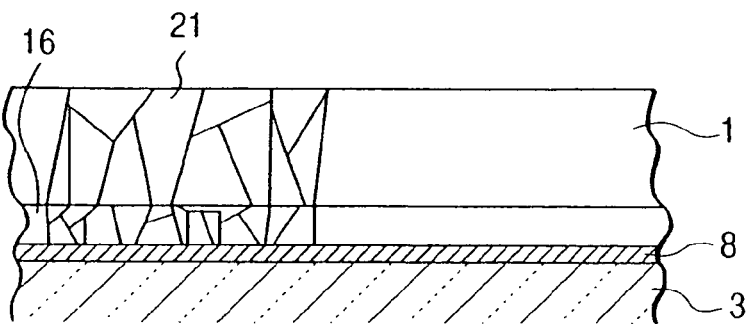

Then, as shown in FIG. 9E, XeCl excimer laser of 308 nm in wavelength or KrF excimer laser of 248 nm in wavelength (not shown) is irradiated onto the a-Si film 18 to transform the a-Si film 18 into the p-Si film to form a region corresponding to the p-Si island 1.

Figure 9F:
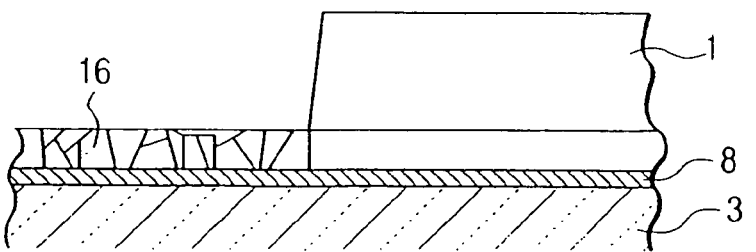

Then the p-Si film 21 surrounding the p-Si island 1 is removed by a photolithography technique to provide the shape as shown in FIG. 9F.

Then the thus obtained p-Si island 1 is processed to complete the p-Si TFT 100 shown in FIG. 1A by using known techniques. The p-Si film 16 in FIG. 9F corresponds to the conductive film 2 in FIG. 1A.

As still another alternative, the process steps of forming a film made of metal or metallic silicide and having the openings 15 can be repeated twice with the process of forming the a-Si film interposed therebetween, that is, the two films made of metal or metallic silicide can be disposed to sandwich the a-Si film. The following explains this alternative.

Figure 10A:
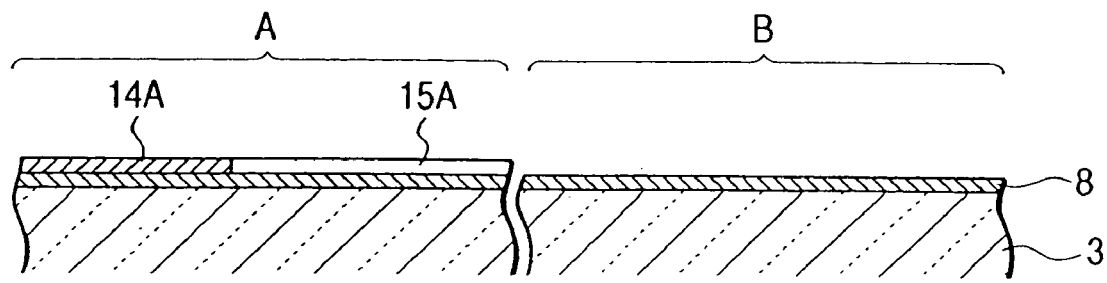
FIGS. 10A to 10C are cross-sectional views of a film in the process steps for fabricating a p-Si TFT in accordance with another embodiment of the present invention.

Initially, as shown in FIG. 10A, a buffer layer 8 made of $SiO_2$ is formed on the insulating substrate 3 made of glass, then a film 14 made of tungsten, tungsten silicide, or metals such as Au, Al, Sb, Pd and Ni, for example, is formed at a region A corresponding to the peripheral circuit on the insulating substrate 3 and an opening 15A corresponding to a TFT region is made in the film 14A by a photolithography technique.

Figure 10B:
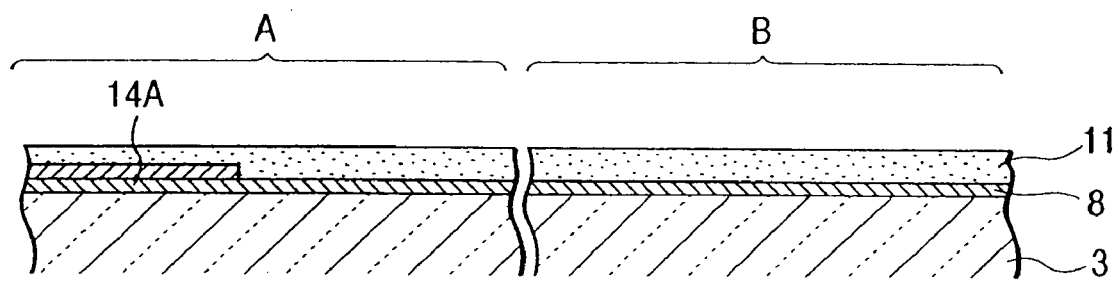

Then, as shown in FIG. 10B, a-Si film 11 of 20 nm at the most in thickness is formed at the region A corresponding to the peripheral circuit and a region B corresponding to the pixel area by a plasma CVD method, and is heated at 450° C. for at least 30 minutes to reduce the amount of hydrogen contained in the a-Si film 11 to 1 atomic % at the most.

Figure 10C:
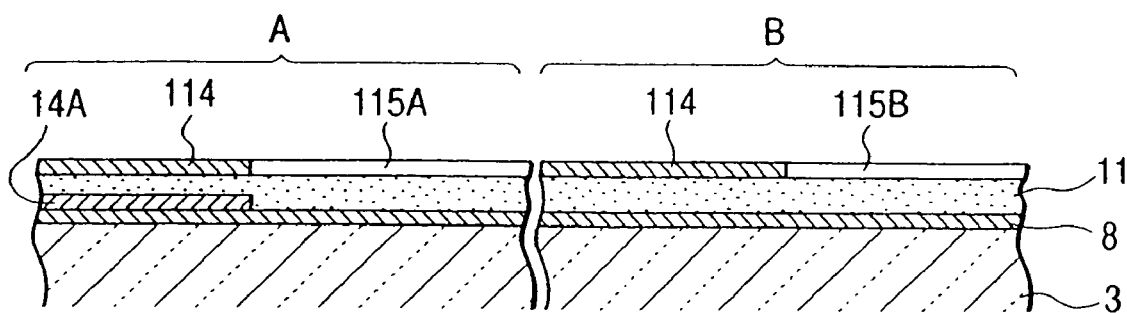

Then, as shown in FIG. 10C, a film 114 made of metals such as Au, Al, Sb, Pd and Ni is formed at the regions A and B corresponding to the peripheral circuit and the pixel area, respectively, on the insulating substrate 3, and an opening 115A coincident with the opening 15A is made in the region A by a photolithography technique and an opening 115B corresponding to the pixel-switching TFT region is made in the region B by a photolithography technique. Then the a-Si film 11 is thermally annealed at a temperature equal to or less than 600° C. to transform the a-Si film 11 into the p-Si film by solid-phase growth. The subsequent process steps are the same as those with the previous embodiments.

EXAMPLE

Initially a region of 5 mm in width for the peripheral circuit is defined at the periphery outside of the pixel area of the 13-inch diagonal SXGA liquid crystal display panel (1024×1280 pixels). Then a tungsten film of 50 nm in thickness is formed over the entire surface of the insulating substrate made of glass, a Pd film of 1 nm in thickness is formed over the tungsten film, and then the openings each accommodating a transistor are made in the two metal films in accordance with the arrangement of the p-Si islands for transistors.

Then a first a-Si film of 20 nm in thickness is formed over the films by a low pressure CVD method, and is thermally annealed at 550° C. for three hours to transform the first a-Si film into the polycrystalline film. Next a second a-Si film of 50 nm in thickness is formed over the polycrystalline film by a plasma CVD method and is dehydrogenated by being heated at 450° C. for an hour in nitrogen.

XeCl excimer laser of 308 nm in wavelength is irradiated onto the second a-Si film to transform the second a-Si film into the polycrystalline film. Laser crystallization of the pixel area is performed separately from that of the peripheral circuit area.

The pixel area is irradiated by using an illuminating system which illuminates an elemental area in the form of a slit of 100 μm in width and 250 mm in length. The center line of the 100 μm width of the slit is aligned with the center of a pixel-switching transistor and the long sides of the slit is aligned parallel to the gate signal lines (see FIG. 13). The laser is irradiated onto the substrate mounted on the stage at rest with ten shots each having fluence of 300 $mJ/cm^2$ at one position, moving the stage a distance equal to a pitch of pixels in a source-drain direction at a time.

The peripheral circuit area is irradiated by using an imaging optical system which illuminates an elemental area in the form of a rectangle of 5×18 $mm^2$. The laser is irradiated onto the substrate mounted on the stage at rest with five shots each having fluence of 300 $mJ/cm^2$ at one position, moving the stage a distance of 18 mm in a direction of the periphery of the peripheral circuit at a time.

Then, the substrate of the TFT liquid crystal panel is completed after the process steps such as forming the gate oxide film on the p-Si film formed as above by a plasma CVD, forming the gate electrodes, forming the source and drain regions by ion implantation into the p-Si film and forming interlayer insulating films, contact holes and wirings.

Figure 11:
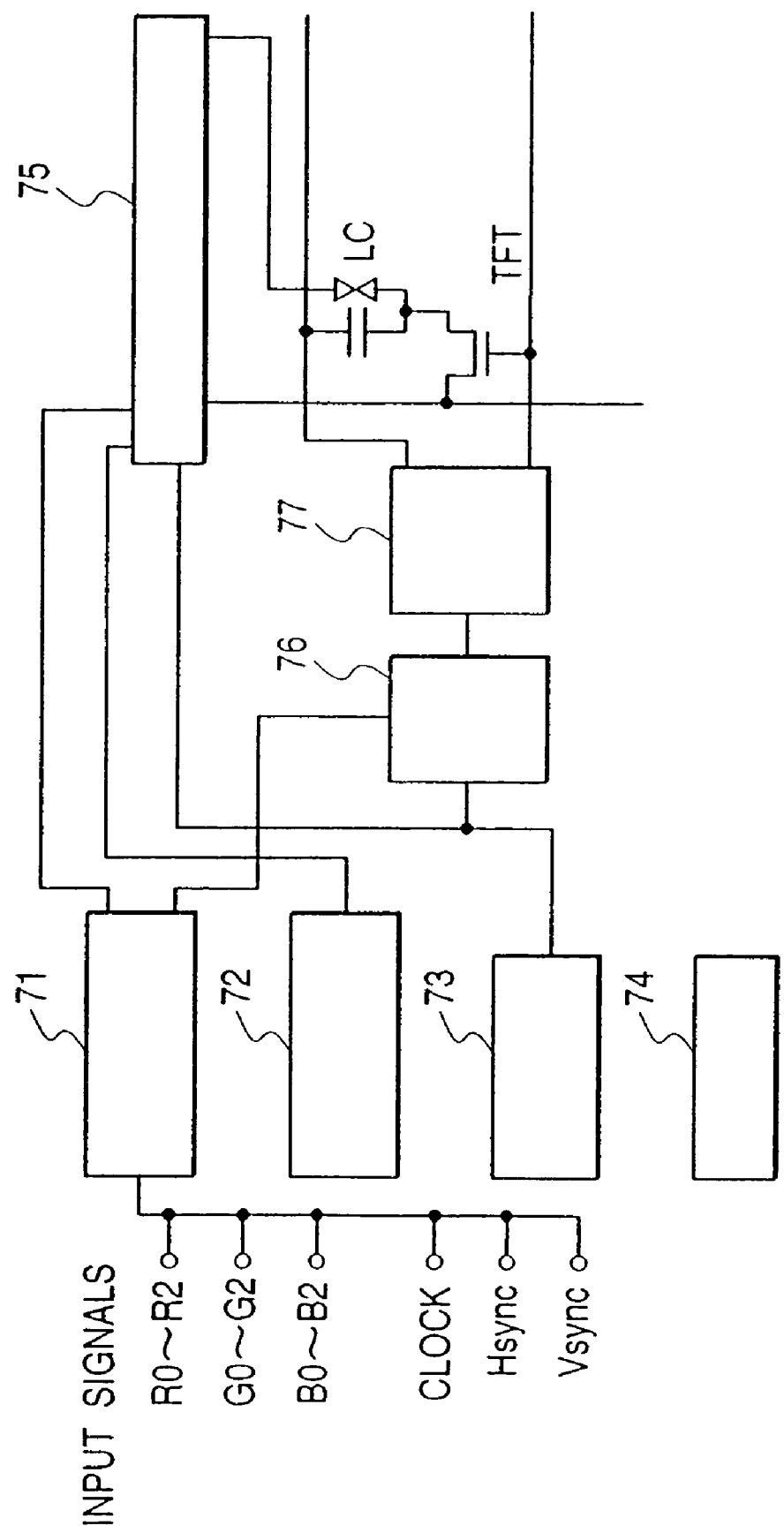
FIG. 11 is a block diagram of a driver circuit constituting a peripheral circuit of a liquid crystal display panel.

FIG. 11 is a block diagram of a driver circuit constituting a peripheral circuit of the liquid crystal display panel. Reference numeral 71 denotes a timing control circuit, 72 is a gray scale-source voltage circuit, 73 is a common-electrode voltage circuit, 74 is a power supply circuit, 75 is a source driver, 76 is a gate power supply circuit and 77 is a gate driver.

Figure 12A:
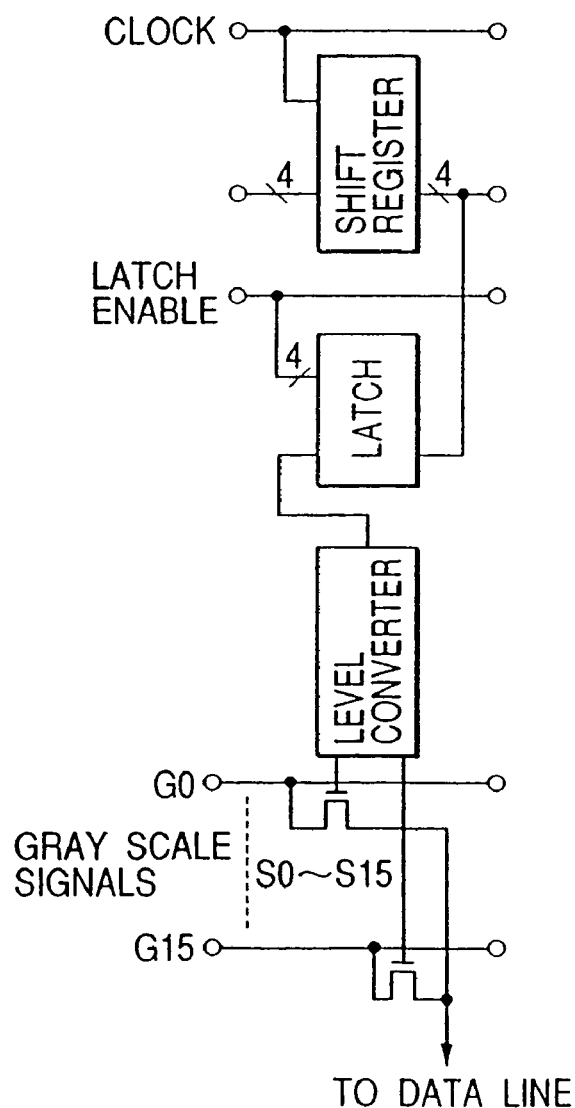
FIGS. 12A and 12B are block diagrams of a source driver of FIG. 11 corresponding to one bit of data, respectively, FIG. 12A being a block diagram of a digital driver and FIG. 12B being a block diagram of an analog driver.
Figure 12B:
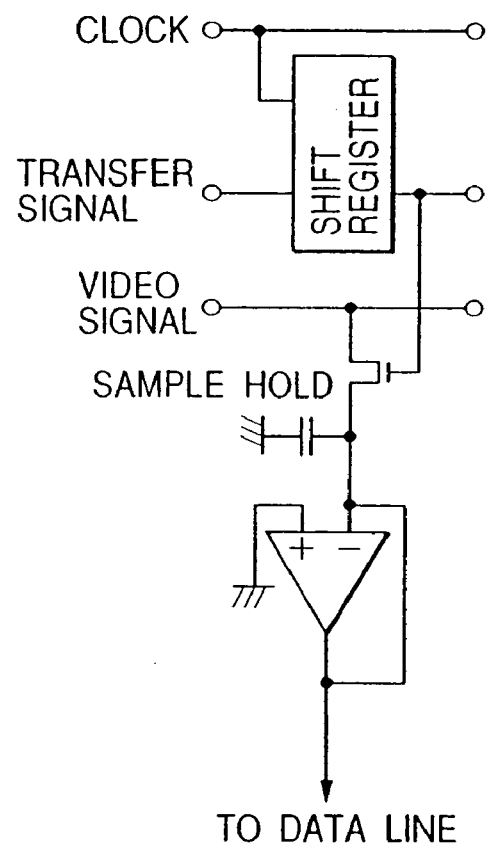

FIGS. 12A and 12B are block diagrams for source drivers of FIG. 11 corresponding to one bit data, FIG. 12A being that of a digital driver and FIG. 12B being that of an analog driver.

Figure 13:
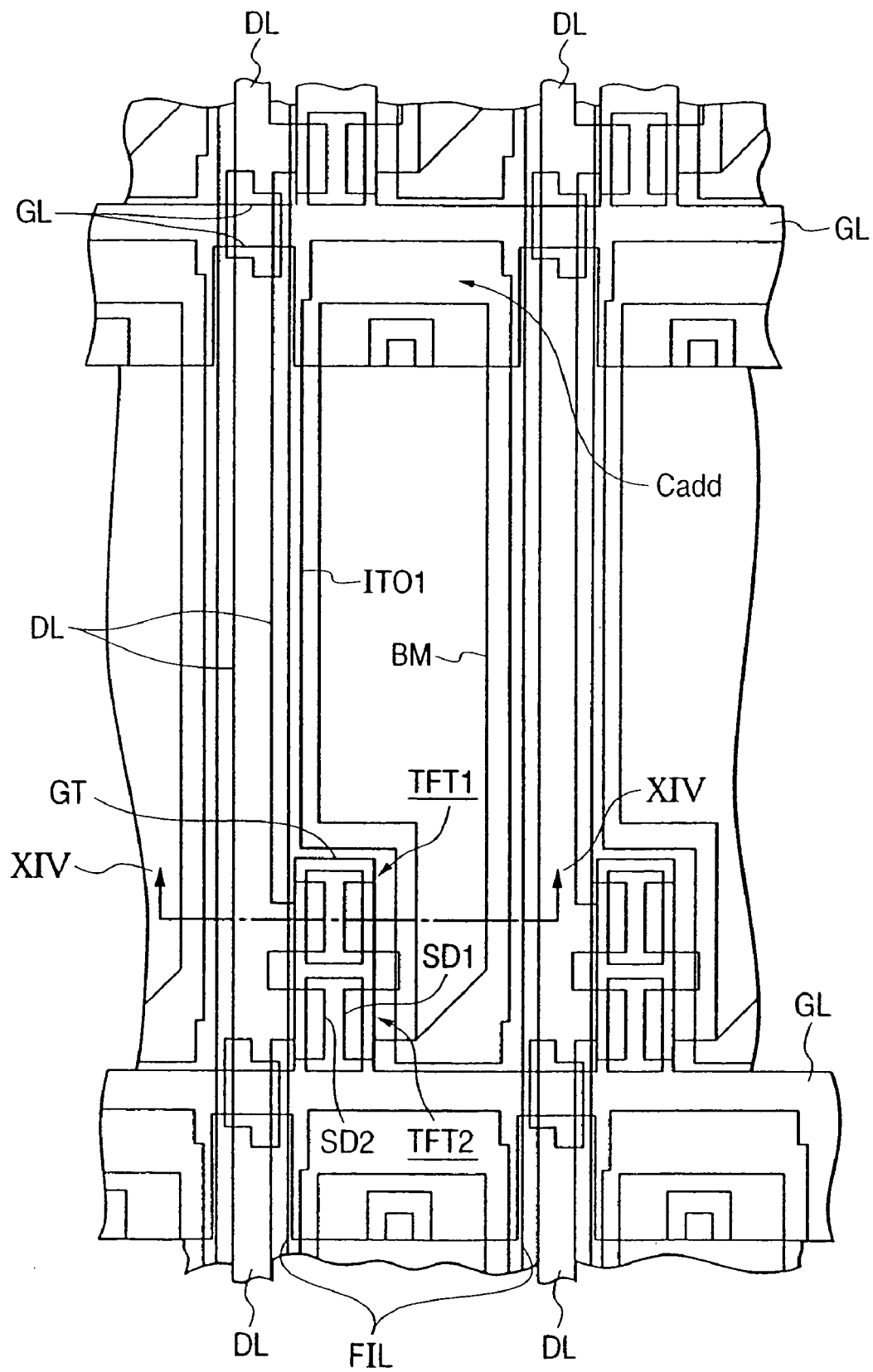
FIG. 13 is a plan view of essential portions of one pixel and its vicinities of an active matrix and vertical-field type color liquid crystal display panel to which the present invention is applicable.
Figure 14:
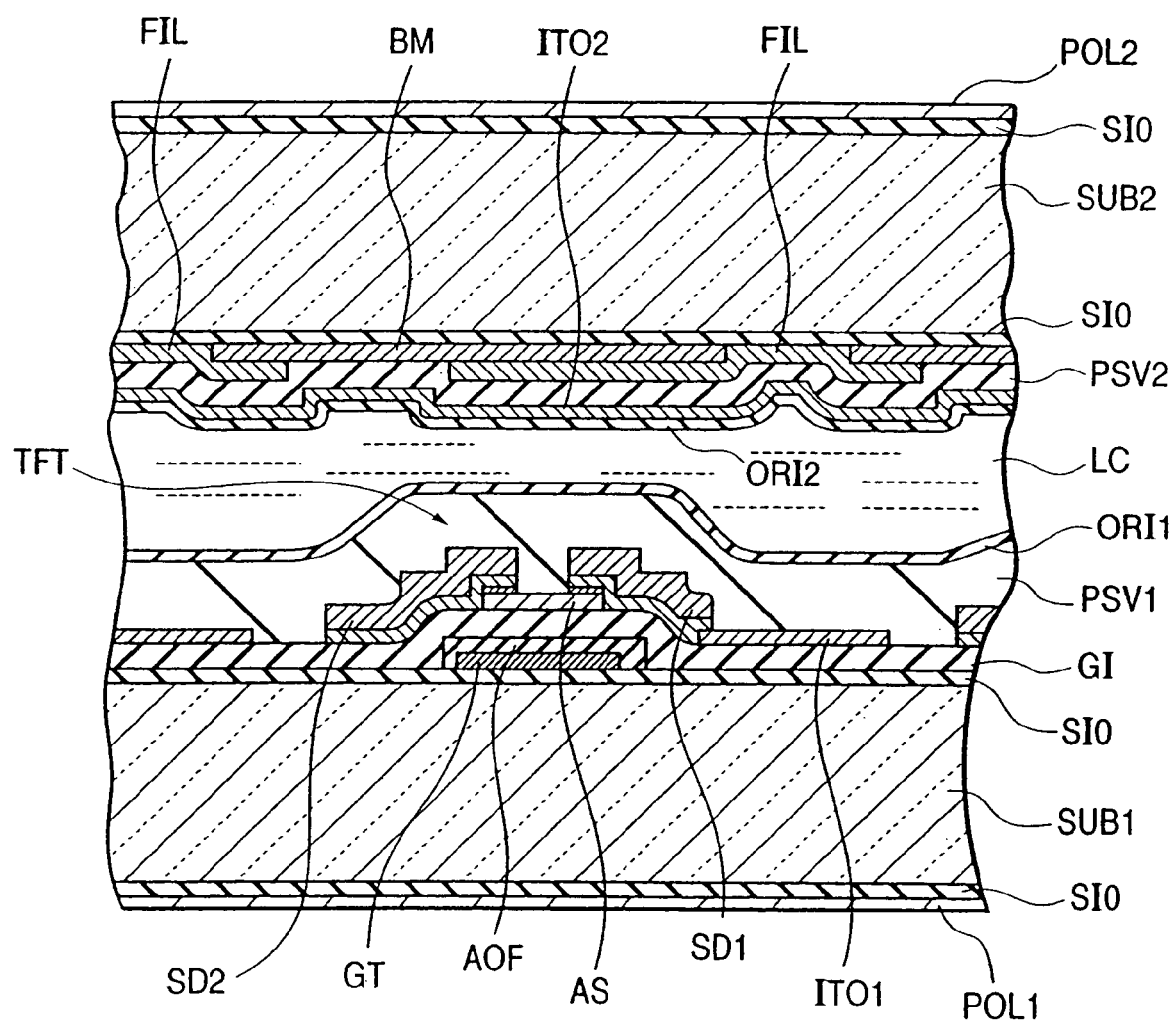
FIG. 14 is a cross-sectional view of one pixel and its vicinities of FIG. 13 taken along line XIV-XIV.

FIG. 13 is a plan view of a pixel and its vicinity in a vertical-field (twisted nematic) and active matrix addressing type color liquid crystal display panel to which the present invention is applicable, and FIG. 14 is a cross-sectional view of the pixel and its vicinity taken along the line XIV-XIV of FIG. 13.

As shown in FIG. 13, each pixel is arranged in an area defined by two adjacent scanning signal lines GL (also referred to as gate signal lines or horizontal signal lines) and two adjacent video signal lines DL (also referred to as drain signal lines or vertical signal lines).

Each pixel includes two thin film transistors TFT1, TFT2, a transparent pixel electrode ITO1 and a holding capacitor Cadd. The scanning signal lines GL extend in a left-right direction in FIG. 13 and are arranged plurally in a top-bottom direction in FIG. 13. The video signal lines DL extend in the top-bottom direction and are arranged plurally in the left-right direction. Reference characters SD1 and SD2 denote source and drain electrodes, respectively, GT is a gate electrode, FIL is a color filter and BM is a black matrix.

As shown in FIG. 14, on a lower transparent glass substrate SUB1 which is placed under a liquid crystal layer LC, a thin film transistor TFT and a transparent pixel electrode ITO1 are formed, and on an upper transparent glass substrate SUB2 a color filter FIL, and a light-blocking black matrix pattern BM are formed. The upper and lower transparent glass substrates SUB1, SUB2 are coated with silicon oxide films SIO on both sides thereof by dipping treatment.

The light-blocking layer BM, color filters FIL, a protective film PSV2, a transparent common pixel electrode ITO2 (COM) and an upper alignment film ORI2 are formed in this order on the inner surface of the upper transparent glass substrate SUB2 on the liquid crystal layer LC side thereof. Reference characters POL1, POL2 denote polarizers, PSV1 is a protective film, ORI1 is a lower alignment film, GI is a gate insulating film, AOF is an anodized film and AS is a semiconductor layer.

Figure 15:
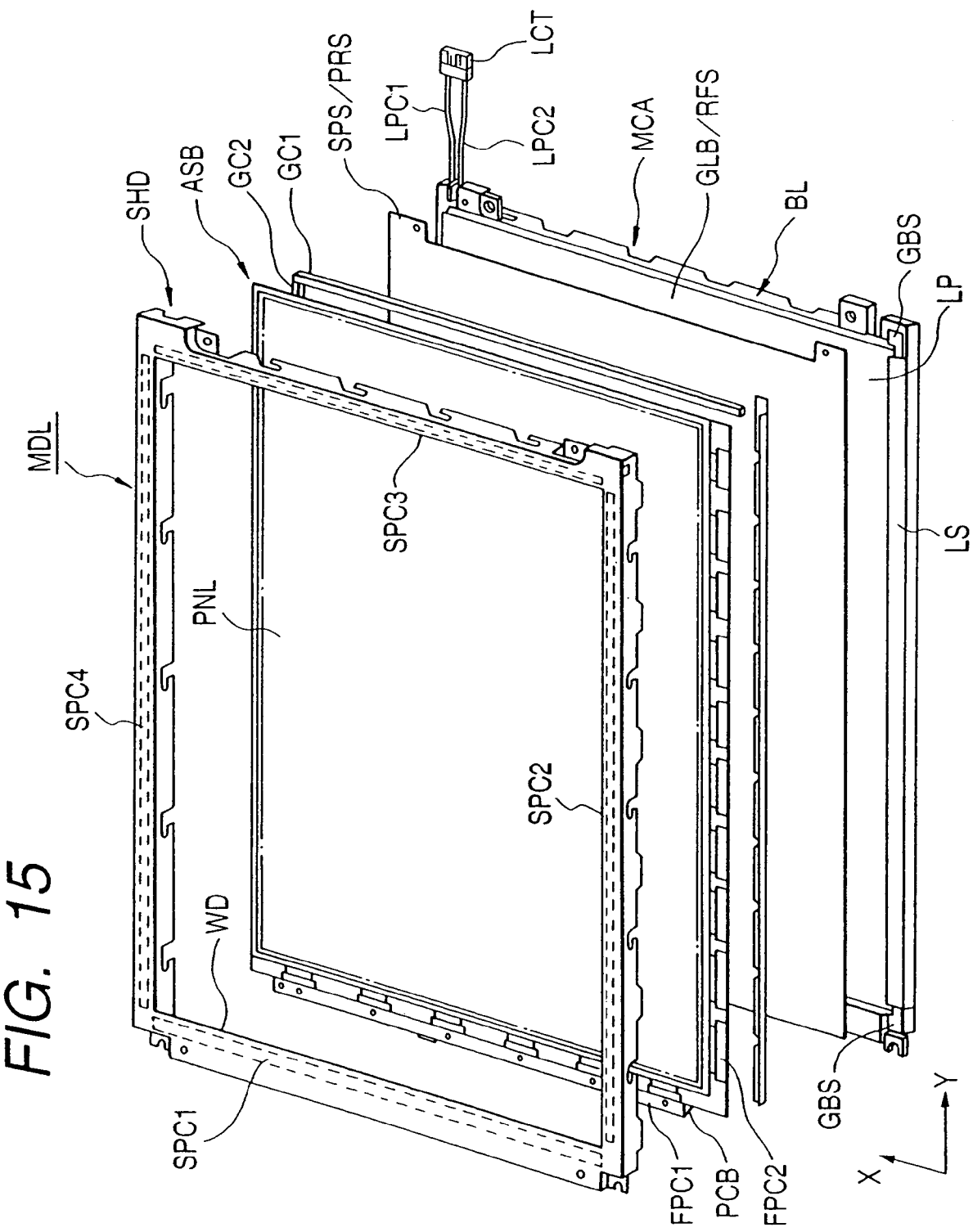
FIG. 15 is an exploded perspective view of a liquid crystal display module to which the present invention is applicable.

FIG. 15 is an exploded perspective view of an active-matrix, flip-chip type color liquid crystal display module (an LCD) MDL to which the present invention is applicable. Reference character SHD designates a metal shield case (referred to a metal frame); WD is a display window; SPC1 to SPC4 are insulating spacers; FPC1 and FPC2 are folded multilayer flexible circuit boards (FPC1 is the circuit board for gate drive and FPC 2 is the circuit board for drain drive); PCB is an interface circuit board; ASB is an assembled liquid crystal display element with the driver circuit boards; PNL is a liquid crystal display element having driver ICs mounted on one of a pair of transparent insulating substrates overlapped and fixed with a spacing therebetween (also referred to as a liquid crystal display panel); GC1 and GC2 are rubber cushions; PRS are two prismatic sheets; SPS is a light-diffusing sheet; GLB is a light guide; RFS is a reflecting sheet; MCA is a lower case (a mold case) integrally molded; LP is a fluorescent lamp; LPC1 and LPC2 are lamp cables; LCT is a connector for an inverter power source; and GB is a rubber bush for holding the fluorescent lamp. These components are stacked in the relationship as shown in FIG. 15 to assemble the liquid crystal display module MDL. Reference characters LS and BL denotes a light reflector and a backlight, respectively.

Figure 16:
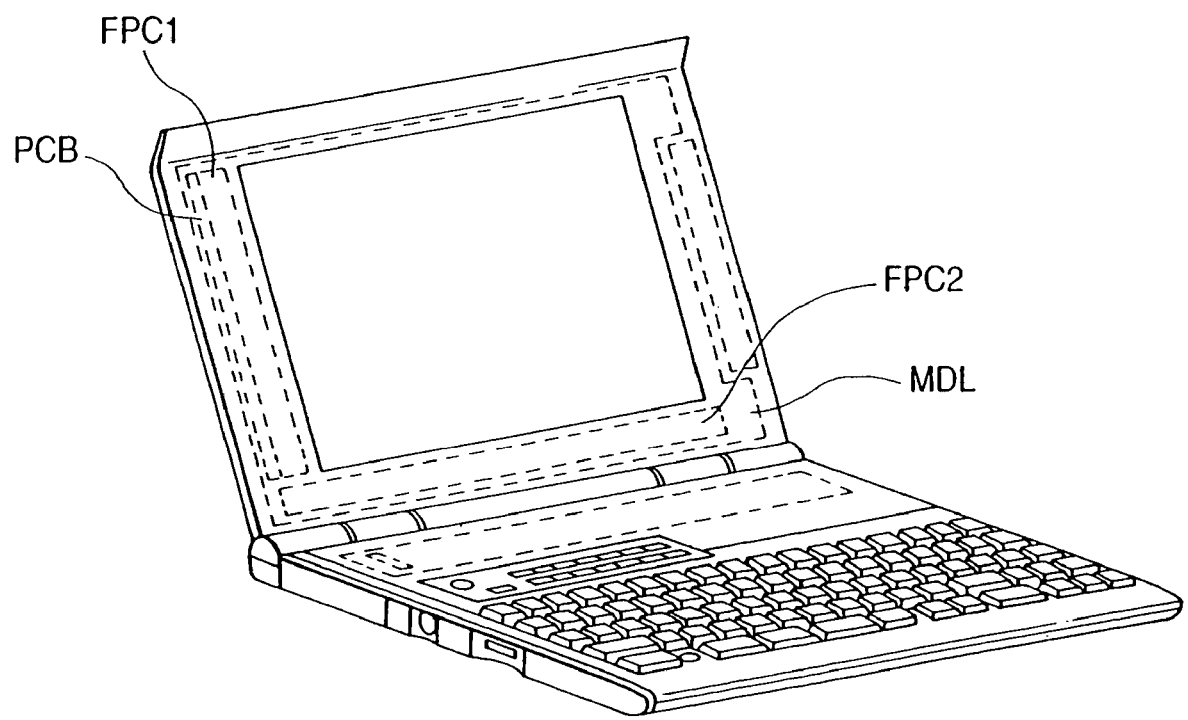
FIG. 16 is a perspective view of a notebook personal computer or a word processor incorporating the liquid crystal display module of FIG. 15.

FIG. 16 is a perspective view of a notebook personal computer or a word processor incorporating the liquid crystal display module of FIG. 15.

The present invention has been explained in detail by using the above embodiments, but the present invention is not limited to the above embodiments and it will be obvious to those skilled in the art that various changes and modifications can be made to the above embodiments without departing from the nature and spirits of the present invention.

For example, in the above embodiments, Si is used, but other semiconductor materials such as germanium and silicon germanium alloy can be used instead.

The present invention is not limited to liquid crystal display devices, but is also applicable to semiconductor devices having a TFT of the SOI structure.

In the case where the present invention is applied to the liquid crystal display devices, the present invention is also applicable to the liquid crystal display devices of the simple matrix type, the vertical field (twisted nematic) active matrix type, the in-plane switching active matrix type or the COG (Chip-On-Glass).

As explained above, the present invention provides a high-performance polycrystalline TFT having a polycrystalline film uniform in orientation of crystalline grains and containing few unwanted impurities introduced in grain boundaries and a channel region of the TFTs formed of a polycrystalline film comprising a small number of crystalline grains each having a diameter larger than a length of a channel of the TFTs and each having a grain boundary thereof aligned parallel with a source-drain direction of the TFTs. In the structure of the SOI, the substrate potential is established such that the charges accumulated in the end portions of the drain and source regions and the central portion of the channel can be extracted efficiently to provide high-performance transistors. And the present invention realize the high-definition liquid crystal display panel with the driver circuits and the control circuits integrally formed on the substrate of the display panel

What is claimed:

1. A display device comprising a pixel region having a plurality of pixels and a peripheral circuit region disposed adjacent to said pixel region including circuits coupled to said plurality of pixels,
    wherein said peripheral circuit region includes polycrystalline thin film transistors comprised of polycrystalline semiconductor and having a semiconductor crystalline grain of a first kind in a channel region thereof;
    wherein a grain size of said semiconductor crystalline grain of said first kind in a channel region of one of said polycrystalline thin film transistors is large enough to extend into both source and drain regions disposed on opposite sides of said channel region of said one of said polycrystalline thin film transistors,
    wherein a respective one of said polycrystalline thin film transistors is fabricated in an island form, and a channel region of said respective one of said polycrystalline thin film transistors includes at least one crystal grain having a crystal grain boundary, in a top surface of said channel region, in a direction of a line connecting a drain region and a source region of said respective one of said polycrystalline thin film transistors, and
    wherein a grain size of semiconductor crystalline grains in said channel regions of said polycrystalline thin film transistors in said peripheral circuit region is at least 3 μm, and a grain size of semiconductor crystalline grains in channel regions of polycrystalline thin film transistors in said pixel region is in a range of from 0.05 μm to 0.3 μm.

2. A display device according to claim 1, wherein crystal growing in said channel region of said respective one of said polycrystalline thin film transistors is performed by scanning a laser in said direction of the line connecting said drain region and said source region.

3. A display device according to claim 1, wherein each of said plurality of pixels is provided with a polycrystalline thin film transistor, and a channel region thereof is formed by using metal induced solid phase growth.

4. A display device according to claim 1, wherein the number of grain boundaries in a channel region of each of said polycrystalline thin film transistors of said plurality of pixels is larger than the number of grain boundaries of a channel region of each of said plurality of polycrystalline thin film transistors of said peripheral circuit region.

5. A display device according to claim 4, wherein crystal growing in said polycrystalline thin film transistors of said peripheral circuit region is performed by scanning a laser in a direction of a line connecting a drain region and a source region of a corresponding one of said polycrystalline thin film transistors of said peripheral circuit region.

6. A display device according to claim 5, wherein said channel region of each of said polycrystalline thin film transistors of said plurality of pixels is formed by using metal induced solid phase growth.

7. A display device comprising a pixel region having a plurality of pixels and a peripheral circuit region disposed adjacent to said pixel region including circuits coupled to said plurality of pixels,
    wherein said peripheral circuit region includes polysilicon thin film transistors comprised of polysilicon semiconductor and having a semiconductor crystalline grain of a first kind in a channel region thereof;
    wherein a grain size of said semiconductor crystalline grain of said first kind in a channel region of one of said polysilicon thin film transistors is large enough to extend into both source and drain regions disposed on opposite sides of said channel region of said one of said polysilicon thin film transistors, wherein a respective one of said polysilicon thin film transistors is fabricated in an island form, and a channel region of said respective one of said polysilicon thin film transistors includes at least one crystal grain having a crystal grain boundary, in a top surface of said channel region, in a direction of a line connecting a drain region and a source region of said respective one of said polysilicon thin film transistors, and wherein a grain size of semiconductor crystalline grains in said channel regions of said polysilicon thin film transistors in said peripheral circuit region is at least 3 μm, and a grain size of semiconductor crystalline grains in channel regions of polysilicon thin film transistors in said pixel region is in a range of from 0.05 μm to 0.3 μm.

8. A display device according to claim 7, wherein crystal growing in said channel region of said respective one of said polysilicon thin film transistors is performed by scanning a laser in said direction of the line connecting said drain region and said source region.

9. A display device according to claim 7, wherein each of said plurality of pixels is provided with a polysilicon thin film transistor, and a channel region thereof is formed by using metal induced solid phase growth.

10. A display device according to claim 7, wherein the number of grain boundaries in a channel region of each of said polysilicon thin film transistors of said plurality of pixels is larger than the number of grain boundaries of a channel region of each of said plurality of polysilicon thin film transistors of said peripheral circuit region.

11. A display device according to claim 10, wherein crystal growing in said polysilicon thin film transistors of said peripheral circuit region is performed by scanning a laser in a direction of a line connecting a drain region and a source region of a corresponding one of said polysilicon thin film transistors of said peripheral circuit region.

12. A display device according to claim 11, wherein said channel region of each of said polysilicon thin film transistors of said plurality of pixels is formed by using metal induced solid phase growth.

* * * * *